United States Patent
Okahisa et al.

(10) Patent No.: US 11,366,261 B2
(45) Date of Patent: Jun. 21, 2022

(54) LIGHT SOURCE DEVICE

(71) Applicant: NICHIA CORPORATION, Anan (JP)

(72) Inventors: Tsuyoshi Okahisa, Tokushima (JP); Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/125,502

(22) Filed: Dec. 17, 2020

(65) Prior Publication Data
US 2021/0199875 A1    Jul. 1, 2021

(30) Foreign Application Priority Data

Dec. 26, 2019   (JP) .............................. JP2019-236924

(51) Int. Cl.
| | |
|---|---|
| *F21V 8/00* | (2006.01) |
| *H01L 25/075* | (2006.01) |
| *H01L 33/58* | (2010.01) |
| *F21V 9/32* | (2018.01) |

(52) U.S. Cl.
CPC .............. *G02B 6/0021* (2013.01); *F21V 9/32* (2018.02); *H01L 25/0753* (2013.01); *H01L 33/58* (2013.01)

(58) Field of Classification Search
CPC ...... F21V 5/007; F21V 7/0091; F21V 17/002; F21V 5/04; F21V 29/83; F21V 29/507; G02B 19/0066; G02B 19/0028; G02B 6/0021; F21S 8/04; F21S 8/033; F21Y 2105/10; F21Y 2103/10; F21Y 2115/10
See application file for complete search history.

(56) References Cited

U.S. PATENT DOCUMENTS

| | | | | |
|---|---|---|---|---|
| 7,918,583 | B2 * | 4/2011 | Chakmakjian | ........ F21V 17/002 362/240 |
| 10,164,149 | B1 * | 12/2018 | Yoo | ........................ H01L 33/387 |
| 2007/0085103 | A1 * | 4/2007 | Nishioka | ............... H01L 33/507 257/E33.072 |

(Continued)

FOREIGN PATENT DOCUMENTS

| | | |
|---|---|---|
| JP | 2007-234403 A | 9/2007 |
| JP | 2013-156335 A | 8/2013 |

(Continued)

*Primary Examiner* — Fatima N Farokhrooz
(74) *Attorney, Agent, or Firm* — Foley & Lardner LLP

(57) ABSTRACT

A light source device includes a substrate having an upper surface including mounting areas; light-emitting elements on the upper surface of the substrate in the mounting areas; a light-shielding member on an upper surface of at least one of the light-emitting elements; and a light guide member defining, in a lower surface, first recesses and at least one second recess. The light-emitting elements are disposed on the mounting areas in the first recesses. Light emitted from the light-emitting elements enters the light guide member through first inner surfaces defining the first recesses, is reflected at second inner surfaces defining the second recess toward the upper surface of the light guide member, is emitted from the upper surface of the light guide member, and illuminates illumination areas at positions that are point-symmetrical, with respect to a point above the substrate, to the mounting areas where the light-emitting elements are disposed.

17 Claims, 17 Drawing Sheets

(56) References Cited

U.S. PATENT DOCUMENTS

| | | | |
|---|---|---|---|
| 2007/0201225 A1* | 8/2007 | Holder | F21V 19/02 362/227 |
| 2008/0043466 A1* | 2/2008 | Chakmakjian | G02B 19/0066 362/237 |
| 2009/0290360 A1* | 11/2009 | Wilcox | G02B 19/0028 362/327 |
| 2010/0277919 A1 | 11/2010 | Okada et al. | |
| 2011/0038150 A1* | 2/2011 | Woodgate | G02B 19/0066 362/235 |
| 2013/0064531 A1 | 3/2013 | Pillman et al. | |
| 2013/0234175 A1 | 9/2013 | Okada et al. | |
| 2014/0061689 A1* | 3/2014 | Seibel | H01L 25/0753 257/89 |
| 2014/0285994 A1* | 9/2014 | Suzuki | F21S 41/16 362/351 |
| 2014/0353697 A1 | 12/2014 | Okada et al. | |
| 2014/0355273 A1 | 12/2014 | Saito | |
| 2015/0009649 A1* | 1/2015 | Jagt | H01L 33/507 362/230 |
| 2016/0186958 A1 | 6/2016 | Nagahara et al. | |
| 2018/0113353 A1* | 4/2018 | Chen | G02F 1/133528 |
| 2020/0088374 A1 | 3/2020 | Kogure et al. | |
| 2020/0124834 A1* | 4/2020 | Woodgate | G02F 1/133603 |
| 2020/0258867 A1* | 8/2020 | Harrold | G02B 5/22 |
| 2021/0119087 A1* | 4/2021 | Kim | G02F 1/133605 |

FOREIGN PATENT DOCUMENTS

| | | |
|---|---|---|
| JP | 2014-010336 A | 1/2014 |
| JP | 2014-038233 A | 2/2014 |
| JP | 2014-112173 A | 6/2014 |
| JP | 2014-530376 A | 11/2014 |
| JP | 2015-149188 A | 8/2015 |
| JP | 2016-127022 A | 7/2016 |
| JP | 2018-198113 A | 12/2018 |
| JP | 2019-016577 A | 1/2019 |
| WO | WO-2009/011302 A1 | 9/2010 |

* cited by examiner

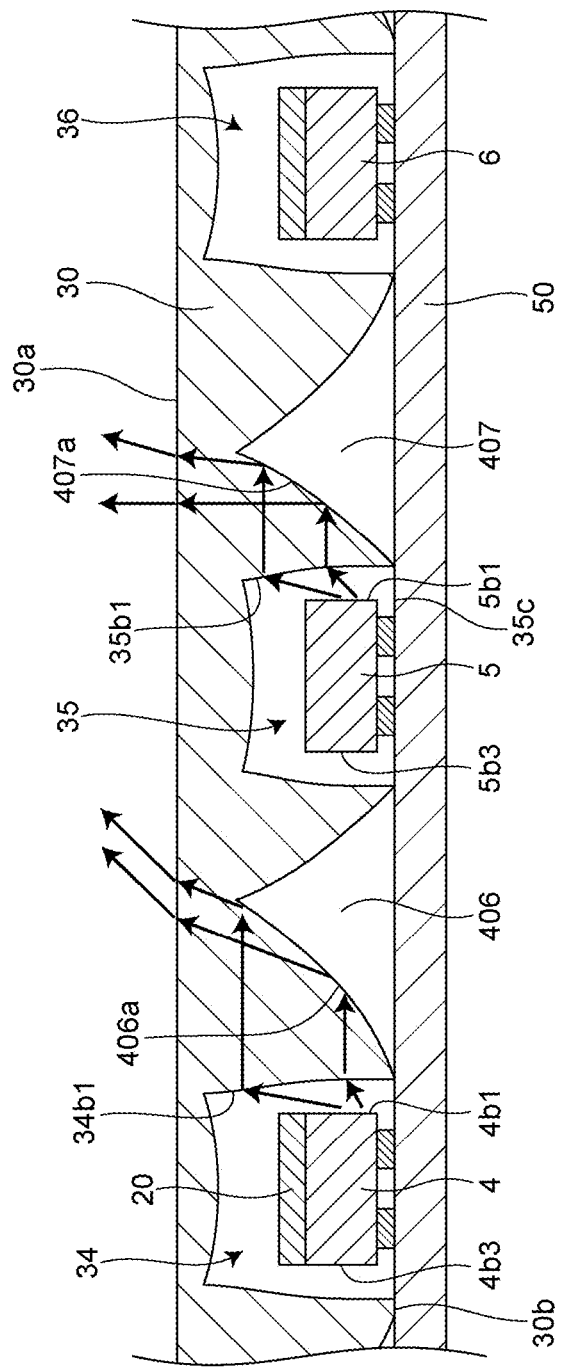

LIGHT SOURCE DEVICE

CROSS-REFERENCE TO RELATED APPLICATION

This application claims priority to Japanese Patent Application No. 2019-236924, filed on Dec. 26, 2019, the entire contents of which are hereby incorporated by reference.

BACKGROUND

The present disclosure relates to a light source device.

Light sources employing light-emitting elements such as light-emitting diodes are becoming widely used in recent years. In particular, demand for light source devices that can illuminate large areas with light emitted from light sources is growing (for example, see Japanese Patent Publication No. 2007-234403).

SUMMARY

However, such a light source device may not illuminate a sufficiently large area with light emitted from a light source, and there is still room for improvement in a light source device that can illuminate a large area with light emitted from a light source.

Accordingly, one object of certain embodiments of the present invention is to provide a light source device that can illuminate a large area with light emitted from a light source.

A light source device according to certain embodiments of the present invention includes a substrate having an upper surface including a plurality of mounting areas; a plurality of light-emitting elements disposed on the upper surface of the substrate such that at least one of the plurality of light-emitting elements is disposed in each of the mounting areas; at least one light-shielding member disposed on an upper surface of at least one of the plurality of light-emitting elements; and a light guide member having an upper surface and a lower surface, the light guide member defining a plurality of first recesses and at least one second recess in the lower surface. The at least one of the plurality of light-emitting elements in each mounting areas is configured to be turned on and off discretely with respect to the at least one of the plurality of light-emitting elements in other mounting areas. Each of the light-emitting elements is disposed on the mounting area in a corresponding one of the first recesses. The second recess comprises annular portions each surrounding a corresponding one of the first recesses in a top view. Light emitted from the light-emitting elements in the first recesses enters the light guide member through first inner surfaces defining the first recesses, is reflected at second inner surfaces defining the second recess toward the upper surface of the light guide member, is emitted from the upper surface of the light guide member, and illuminates illumination areas located at positions point-symmetrical, with respect to a point above the substrate, to the mounting areas on which the light-emitting elements are disposed.

The light source device according to certain embodiments of the present invention having the structure described above can illuminate a large area with light emitted from light sources.

BRIEF DESCRIPTION OF THE DRAWINGS

FIG. 6A is a schematic cross-sectional view of the light source device taken along the line A-A of FIG. 2, showing traveling of light.

FIG. 12A schematically shows a lighting condition on an irradiated surface when all of nine light-emitting elements 1 to 9 of the light source device shown in FIG. 1 are turned on.

FIG. 13A schematically shows a lighting condition when a single light-emitting element 5 disposed at the center among the nine light-emitting elements 1 to 9 of the light source device shown in FIG. 1 is turned on.

FIG. 14A schematically shows a lighting condition in which the single light-emitting element 4 among the nine light-emitting elements 1 to 9 of the light source device shown in FIG. 1 is turned on.

FIG. 15A schematically shows a lighting condition in which the single light-emitting element 7 among the nine light-emitting elements 1 to 9 of the light source device shown in FIG. 1 is turned on.

FIG. 16A schematically shows a lighting condition in which the five light-emitting elements 1 to 3, 6, and 9 among the nine light-emitting elements 1 to 9 of the light source device shown in FIG. 1 are turned on.

DETAILED DESCRIPTION

1. Embodiment

Figure 1:
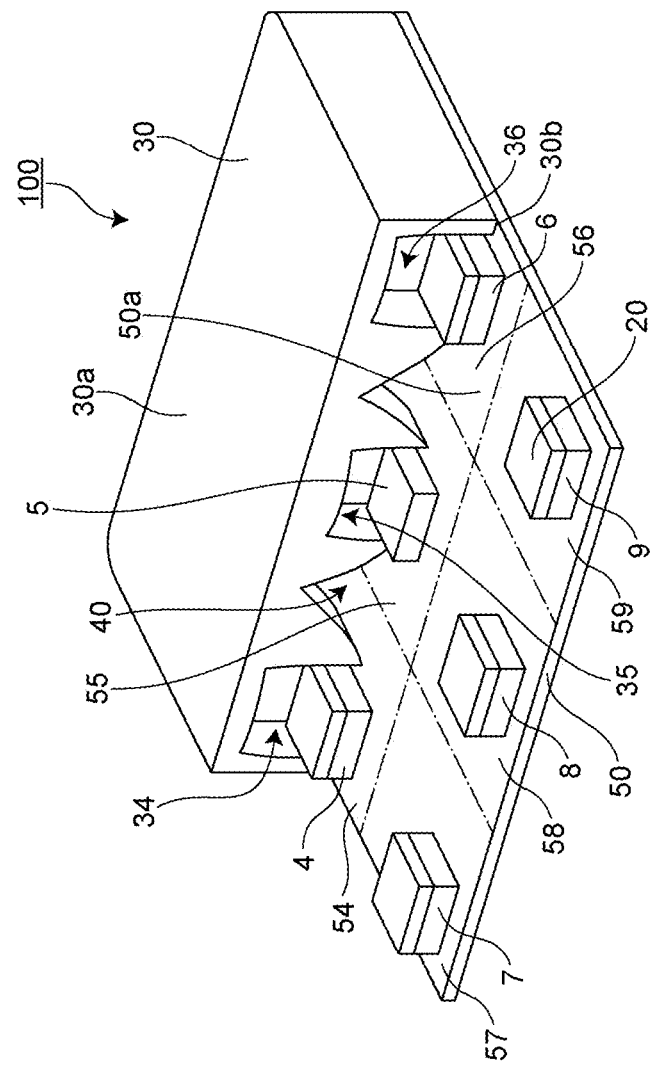
FIG. 1 is a schematic perspective view of a light source device according to one embodiment of the present invention.

A light source device according to one embodiment of the present invention will be described below referring to the drawings.

Figure 2:
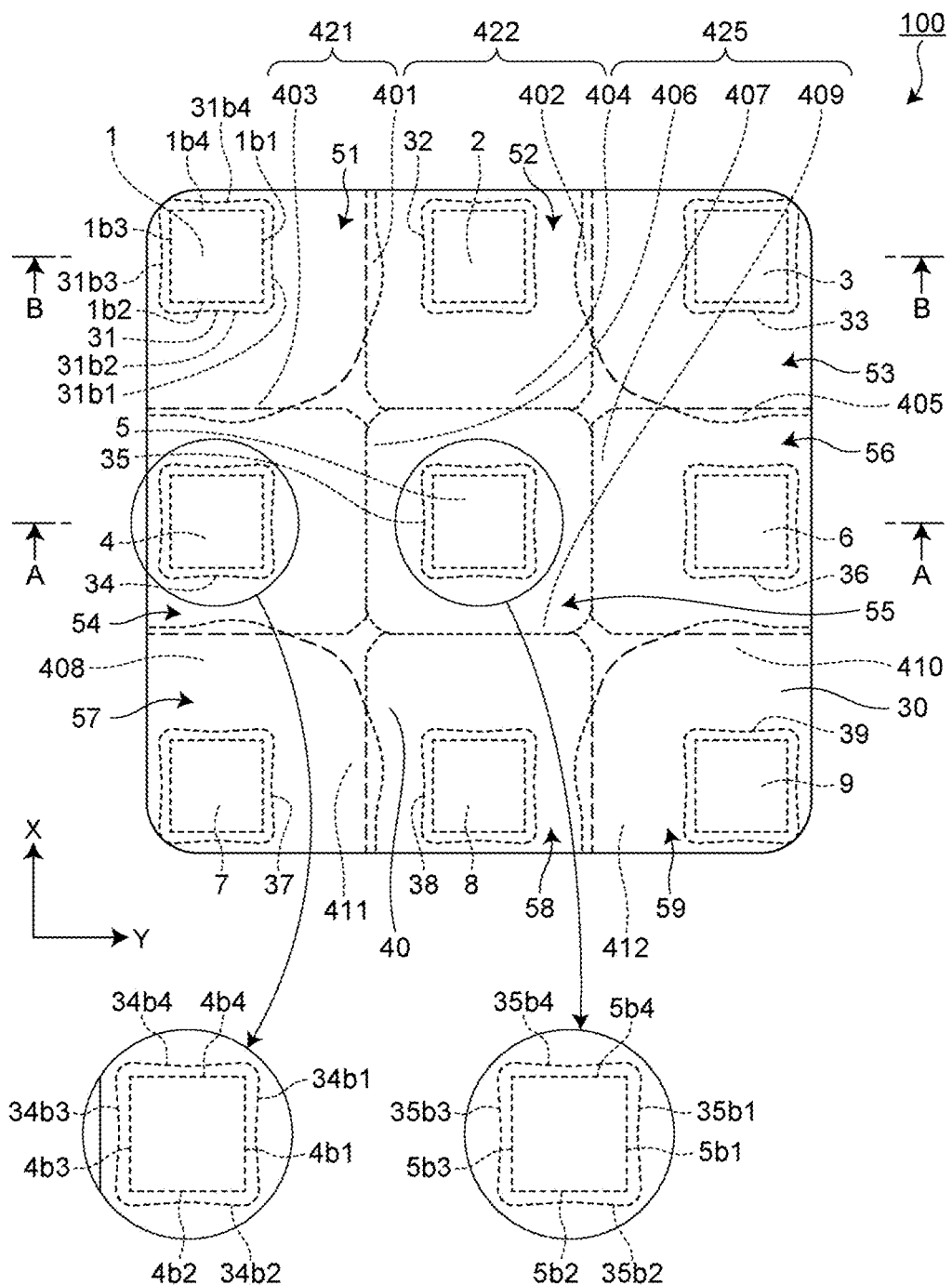
FIG. 2 is a schematic top view of the light source device shown in FIG. 1.

A light source device 100 of the present embodiment is used to illuminate a plurality of illumination areas. As shown in FIG. 1 and FIG. 2, the light source device 100 includes a substrate 50 having an upper surface 50a including a plurality of mounting areas 51 to 59, a plurality of light-emitting elements 1 to 9 disposed on the upper surface 50a of the substrate 50 such that at least one of the light-emitting elements 1 to 9 is disposed in each of the mounting areas 51 to 59, at least one light-shielding member 20 disposed on an upper surface of at least one of the light-emitting elements 1 to 9, and a light guide member 30 having an upper surface 30a and a lower surface 30b. A plurality of first recesses 31 to 39 and at least one second recess 40 are defined in the lower surface 30b of the light guide member 30. To facilitate understanding of the internal structure of the light source device 100, illustration of a portion of the light guide member 30 is omitted in FIG. 1. The circles drawn with solid lines around the light-emitting elements 4 and 5 in FIG. 2 indicate areas to be enlarged to describe the components around the light-emitting elements.

The light-emitting element 1 to 9 in each mounting area is configured to be turned on and off discretely with respect to the light-emitting elements 1 to 9 in other mounting areas. Each of the light-emitting elements 1 to 9 is disposed in a corresponding one of the first recesses 31 to 39 of the light guide member 30. Each of the first recesses 31 to 39 is surrounded by a corresponding one of a plurality of annular portions, which include annular portions 421, 422, and 425, of the second recess 40 in a top view as shown in FIG. 2. To facilitate understanding of the drawing, reference numerals of the annular portions are assigned to only some of the annular portions in FIG. 2.

Light emitted from the light-emitting elements 1 to 9 located in the first recesses 31 to 39 is incident on the light guide member 30 through inner surfaces defining the respective first recesses 31 to 39. The incident light is reflected at inner surfaces defining the second recess 40 toward the upper surface 30a of the light guide member 30. The reflected light is emitted from the upper surface 30a of the light guide member 30. The emitted light illuminates illumination areas located at positions point-symmetrical to the mounting areas 51 to 59 on which the respective light-emitting elements 1 to 9 are disposed with respect to a point O above the substrate 50. It is sufficient that at least two of the mounting areas are point-symmetrical to illumination areas illuminated by the light-emitting elements disposed in the at least two mounting areas with respect to a point above the substrate.

With mounting areas being point-symmetrical to illumination areas with respect to a point above the substrate, a plurality of illumination areas can be illuminated, and the angle of light emitted from the light source device can become close to the horizontal direction (the X direction and/or the Y direction). The angle of light emitted from the light source device becomes close to the horizontal direction (the X direction and/or the Y direction), so that a large area can be illuminated with light from the light source device. The expression "horizontal direction (the X direction and/or the Y direction)" as used herein refers to a direction in which the upper surface of the substrate extends.

The light source device 100 according to the present embodiment having the configuration described above can illuminate a large area with light emitted from light sources.

The structure of the light source device according to the present embodiment will be described below in detail.

A light source device including the nine light-emitting elements 1 to 9 that are disposed in a corresponding one of the respective nine mounting areas 51 to 59 will be described in the description below of the light source device according to the present embodiment. The numbers of the light-emitting elements and the mounting areas in embodiments of the present invention correspond to a desired number of illumination areas, and may be other than nine as long as being equal to or greater than two. The term "correspond" as used in the present specification refers to relationships between an area and an area, a surface and a surface, a member and a member, an area and a member, a surface and a member, an area and a surface, and the like related to each other.

Division of Mounting Area

In the present embodiment, the upper surface 50a of the substrate 50 has the nine mounting areas 51 to 59 in a three-by-three matrix.

Each mounting area has a quadrangular shape, and all the mounting areas have the same shape and size. While the upper surface 50a of the substrate 50 has nine mounting areas in three rows and three columns, it is sufficient that the upper surface 50a of the substrate 50 has two or more mounting areas corresponding to the illumination areas. For example, the upper surface 50a of the substrate 50 may have the mounting areas in n rows and m columns (n≥2 and m≥2). For example, the mounting areas may have a circular shape, an elliptic shape, a substantially polygonal shape having i corners (i≥3).

All the mounting areas may not necessarily have the same shape and/or the same size.

Positional Relationships Between Mounting Areas and Illumination Areas

The light source device 100 according to certain embodiments of the present invention is configured such that the mounting areas correspond to the illumination areas so as to allow one or more desired illumination areas to be selectively illuminated with light emitted from corresponding one or more light-emitting elements configured to be discretely turned on.

Figure 3:
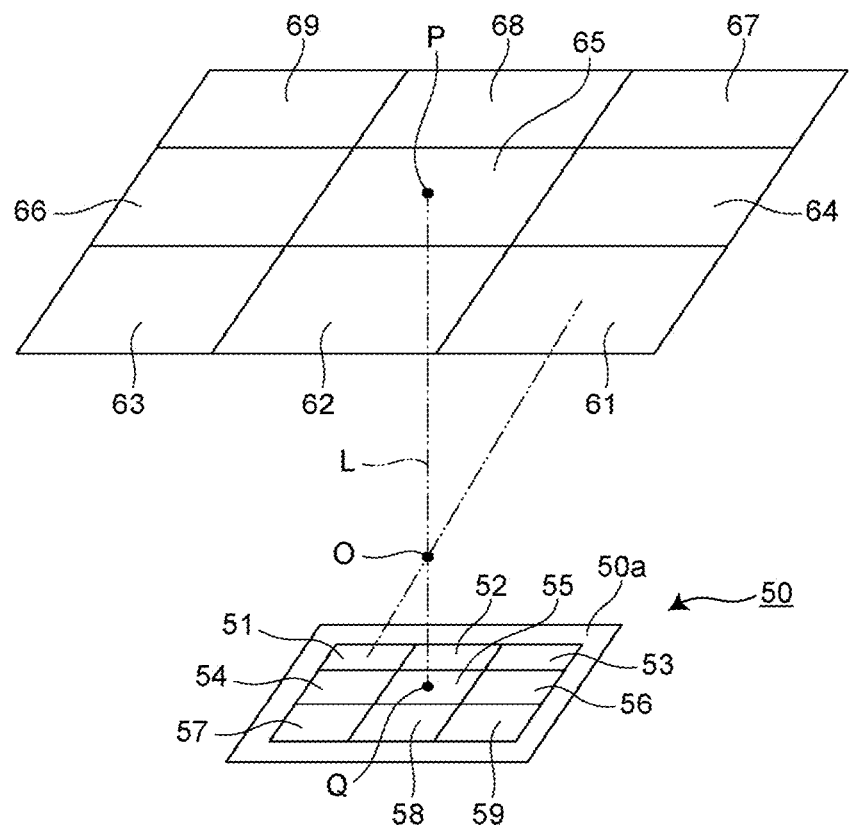
FIG. 3 schematically illustrates point-symmetrical positional relationships between mounting areas and illumination areas of the light source device shown in FIG. 1.

Illumination areas 61 to 69 in the present embodiment are arranged in a three-by-three matrix corresponding to the mounting areas 51 to 59 as shown in FIG. 3. However, any appropriate number and arrangement of the illumination areas may be formed. For example, the mounting areas may be arranged in n rows and m columns (n≥2 and m≥2). For example, the illumination areas may have a circular shape, an elliptic shape, or a substantially polygonal shape having j corners (j≥3). All the illumination areas may not necessarily have the same shape and/or the same size. To facilitate illustration, the illumination areas 61 to 69 are represented as planes in FIG. 3.

In the present embodiment, the mounting areas 51 to 59 and the respective illumination areas 61 to 69 are in point-symmetry with respect to the point O between the upper surface 50a of the substrate 50 and the irradiated surface in the illumination areas 61 to 69. The point-symmetrical positional relationships between the mounting areas 51 to 59 and the illumination areas 61 to 69 in the present embodiment are described in detail referring to FIG. 3.

The point O serving as the center of point symmetry is, for example, a point on a straight line L connecting a center P of the illumination areas 61 to 69 and a center Q of the mounting areas (the upper surface 50*a* of the substrate 50) 51 to 59. The straight line L and the upper surface 50*a* of the substrate 50 intersect at right angles. Each illumination area is located at a position that is point-symmetrical to the corresponding mounting area with respect to the point O. For example, the lower right illumination area 61 among the illumination areas 61 to 69 in FIG. 3 corresponds to the upper left mounting area 51 among the mounting areas 51 to 59 in FIG. 3. Similarly, the other illumination areas 62 to 69 also correspond the respective mounting areas 52 to 59 located at positions point-symmetrical with respect to the point O. The illumination area 65, in which the center P of the illumination areas 61 to 69 is located, is located directly above the corresponding mounting area 55.

The point O serving as the center of point symmetry is not necessarily a point on the straight line L connecting the center P and the center Q, but may be a point on a straight line connecting any point in the illumination areas 61 to 69 and any point in the mounting areas (the upper surface 50*a* of the substrate 50) 51 to 59.

The relationships described are an example of the positional relationships in the present embodiment, and the positional relationships between the illumination areas 61 to 69 and the mounting areas 51 to 59 may be in other positional relationships. For example, the intersecting angle between the straight line L and the upper surface 50*a* of the substrate 50 may not be a right angle.

Constitution of Light-Emitting Element

Figure 4A:
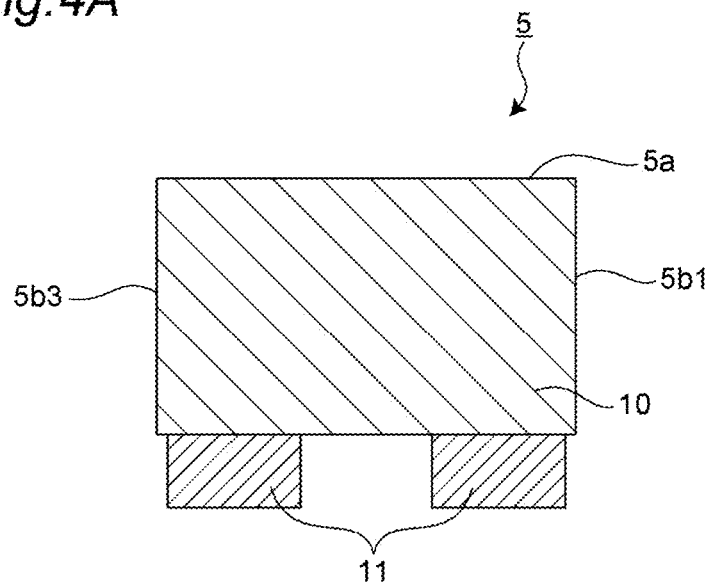
FIG. 4A schematically shows an example of a light-emitting element disposed in a central mounting area of the light source device shown in FIG. 1.
Figure 4B:
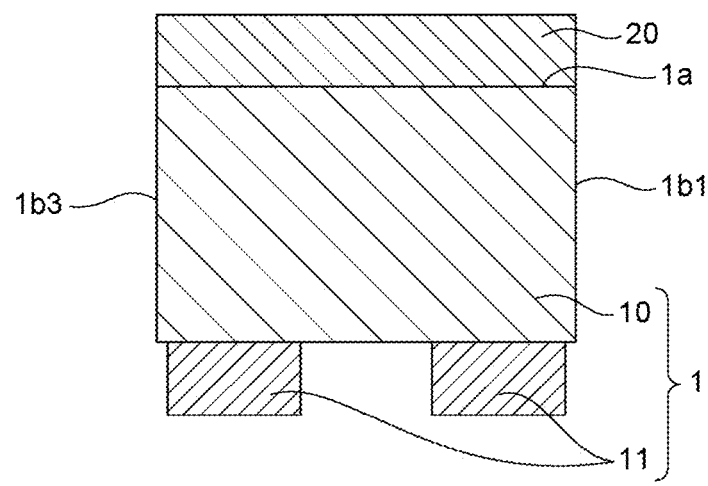
FIG. 4B schematically shows an example of a light-emitting element disposed in an area other than the central mounting area of the light source device shown in FIG. 1.

Each of the light-emitting elements 1 to 9 includes a semiconductor structure 10 and positive and negative electrodes 11 as shown in FIG. 4A. Each of the light-emitting elements 1 to 9 has first to fourth element-lateral-surfaces and has a substantially rectangular parallelepiped shape in appearance. As shown in FIG. 4B, the light-shielding members 20 are disposed on the upper surfaces of the light-emitting elements 1 to 4 and 6 to 9, that is, light-emitting elements other than the light-emitting element 5 that is disposed in the central mounting area 55. With this structure, light emitted from the upper surfaces of the light-emitting elements 1 to 4 and 6 to 9 is shielded by the light-shielding members 20. Light emitted from the four element-lateral-surfaces of each of the light-emitting elements 1 to 4 and 6 to 9 is mainly emitted out of the light-emitting elements 1 to 4 and 6 to 9. When light is emitted from the element-lateral-surfaces of the light-emitting elements, the emitted light can be incident on the inner surfaces defining the second recess at an increased angle of incidence. When the angles of incidence to the inner surfaces defining the second depressed portion increase, the angles of incidence are likely to be larger than the critical angle. Light emitted from the light-emitting elements is thus likely to be totally reflected at the inner surfaces defining the second recess. On the other hand, an upper surface 5*a* of the light-emitting element 5 disposed at the center of the mounting areas is not provided with the light-shielding member 20 in the present embodiment so as to illuminate the illumination area 65 directly above. However, the upper surface 5*a* of the light-emitting element 5 may also be provided with a light-shielding member 20. For example, the light-shielding members may be disposed on all the light-emitting elements. This allows the color of appearance of the light source device 100 to be uniform in a top view, which can improve the appearance as a product.

In the case in which the light-shielding member is disposed on the upper surface 5*a* of the light-emitting element 5, light emitted from the four element-lateral-surfaces enters the light guide member through the inner surfaces defining the first recess 35, is reflected at the inner surfaces defining the second recess toward the upper surface of the light guide member, is emitted from the upper surface of the light guide member, and illuminates the illumination area 65. The light-shielding members are preferably made of a material that reflect light emitted from the light-emitting elements. This allows light emitted from the upper surfaces of the light-emitting elements to be reflected at the light-shielding members and allows for extracting light emitted from element-lateral-surfaces of the light-emitting elements. The light extraction efficiency of the light-emitting elements can thus be enhanced.

The mounting areas on the periphery of the light source device are preferably point-symmetrical to the illumination areas illuminated by the light-emitting elements disposed in the peripheral mounting areas with respect to a point above the substrate. With the peripheral mounting areas being point-symmetrical to the illumination areas with respect to a point above the substrate, the angle of light emitted from the light source device can be close to the horizontal direction (lateral direction). A large area can thus be illuminated with light emitted from the light source device. Accordingly, the light-shielding members 20 are desirably disposed on the light-emitting elements 1 to 4 and 6 to 9 located in a peripheral region of the light source device 100. That is, the light-shielding members 20 are desirably disposed on the upper surfaces of the light-emitting elements mounted in the mounting areas in the first row, n-th row, first column, and m-th column of n rows and m columns of the arrangement of the light-emitting elements. As has already been described, the light-shielding members 20 are not necessarily disposed on the light-emitting elements 1 to 4 and 6 to 9, that is, on light-emitting elements other than the light-emitting element 5 disposed in the central mounting area 55. Rather, the light-shielding members 20 can be disposed on the upper surfaces of desired light-emitting elements.

Arrangement of Light-Emitting Elements

Each of the light-emitting elements 1 to 9 is disposed in a corresponding one of the mounting areas 51 to 59. While all the nine light-emitting elements 1 to 9 are oriented in the same direction in the light source device 100 according to the present embodiment shown in FIG. 1 and FIG. 2, the light-emitting elements 1 to 9 may be disposed to be rotated about the respective central points in a top view.

Structure of Light Guide Member

The light guide member 30 is disposed on the substrate 50 to collectively cover the light-emitting elements 1 to 9 as shown in FIG. 1. The light guide member 30 can be made of, for example, a light-transmissive material containing polycarbonate or acrylic. The lower surface 30*b* of the light guide member 30 defines the first recesses 31 to 39 each of which covers a corresponding one of the light-emitting elements 1 to 9, and the second recess 40 extending over adjacent mounting areas.

The inner surfaces defining the first recesses 31 to 39 refract light emitted from the element-lateral-surfaces of the corresponding light-emitting elements 1 to 9 toward the inner surfaces defining the second recess 40, and the inner surfaces defining the second recess 40 reflect the incident light toward the upper surface 30*a* of the light guide member 30. The light reflected at the inner surfaces defining the second recess 40 is emitted out of the light guide member 30 through the upper surface 30*a*. Light that has reached the upper surface 30a of the light guide member 30 is refracted at the upper surface 30a of the light guide member 30 according to the positional relationships between the mounting areas 51 to 59 in each of which a corresponding one of the light-emitting elements 1 to 9 is disposed and the illumination areas 61 to 69 corresponding to the mounting areas 51 to 59. Light that has been emitted out of the light guide member 30 illuminates the illumination areas 61 to 69 located at positions point-symmetrical to the mounting areas 51 to 59 in which the respective light-emitting elements 1 to 9 are disposed, with respect to the point O above the substrate 50.

The light guide member 30 collectively covers the substrate 50 and the light-emitting elements 1 to 9 disposed on the respective mounting areas 51 to 59.

The upper surface 30a of the light guide member 30 is preferably flat. This structure allows for reducing partial chipping of the upper surface of the light guide member compared with the case in which the upper surface of the light guide member is an irregular surface. With the flat upper surface 30a of the light guide member 30, suction of the upper surface of the light guide member can be facilitated. Accordingly, an operation such as disposing the light guide member on the substrate using a suction nozzle can be facilitated. The term "flat" as used in the present specification includes variations of about ±5 μm.

The light source device 100 according to the present embodiment is configured to irradiate desired illumination areas with light emitted from the corresponding light-emitting elements, using reflection at the inner surfaces defining the second recess. For this reason, light emitted from the corresponding light-emitting elements is needed to be reflected in a predetermined direction at the (second) inner surfaces defining the second recess, which depends on the shape defining the second recess. Light that has been refracted at the (first) inner surface defining the first recess and entered the light-guide member is incident on and reflected at the (second) inner surfaces defining the second recess, which depends on the shape defining the first recess. Refraction of light at the inner surfaces defining the first recesses and reflection of light by the inner surfaces defining the second recess occur due to the difference between the refractive index of the light guide member and the refractive index of a medium in contact with the light guide member, and the difference in refractive index between the light guide member and the medium in contact with the light guide member is also a parameter to be considered when setting the shapes of the inner surfaces defining the first recesses and the inner surfaces defining the second recess. In the light source device 100 according to the present embodiment, the medium in contact with the light guide member 30 is a space, and the difference in refractive index between the light guide member 30 and the medium in contact with the light guide member 30 is the difference in refractive index between the light guide member 30 and the space. For example, air is present in the space. A light reflecting member that reflects light emitted from the light-emitting elements may be disposed inside the second recess. The light reflecting member is preferably is disposed to cover the inner surfaces defining the second recess. This structure allows for reducing incidence of light emitted from the light-emitting elements on the second recess, and accordingly the light extraction efficiency of the light-emitting elements can be increased.

The first recesses 31 to 39 and the second recess 40 will be described below in detail.

First Recess

The first recesses 31 to 39 provided for the respective mounting areas 51 to 59 are defined in the lower surface 30b of the light guide member 30 to cover corresponding the respective light-emitting elements 1 to 9. The nine first recesses 31 to 39 have the same shape. Accordingly, referring to FIG. 2 and FIG. 5, the first recess 35 covering the light-emitting element 5 located at the center will be described below as an example, to describe the shape of the first recesses.

Figure 5:
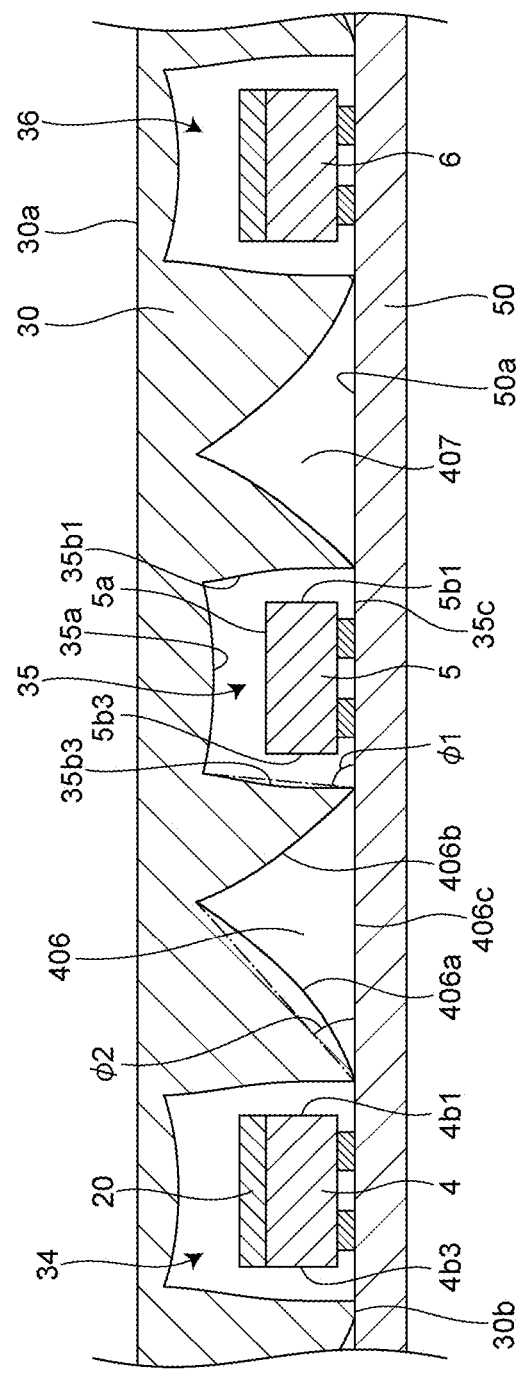
FIG. 5 is a schematic cross-sectional view of the light source device taken along the line A-A of FIG. 2.

The first recess 35 is defined by inner surfaces including an upper surface 35a and four lateral surfaces, that is, first to fourth lateral surfaces 35b1 to 35b4. The first recess 35 has a substantially rectangular cross-sectional shape as shown in FIG. 5. The first to fourth lateral surfaces 35b1 to 35b4 of the first recess 35 faces respective first to fourth element-lateral-surfaces 5b1 to 5b4 of the light-emitting element 5, and the upper surface 35a of the first recess 35 faces the upper surface 5a of the light-emitting element 5. Light emitted from the first to fourth element-lateral-surfaces 5b1 to 5b4 of the light-emitting element 5 is incident mainly on a corresponding one of the first to fourth lateral surfaces 35b1 to 35b4 of the first recess 35 to enter the light guide member 30. Light emitted from the upper surface 5a of the light-emitting element 5 is incident mainly on the upper surface 35a of the first recess 35. In the present specification, a relationship in which a lateral surface (surface) "faces" a lateral surface (surface) encompasses not only a relationship in which two lateral surfaces (surfaces) are parallel to each other, but also includes a relationship in which one lateral surface (surface) confronts the other lateral surface (surface) at an angle.

The first to fourth lateral surfaces 35b1 to 35b4 defining the first recess 35 may be flat or curved and may be orthogonal to or inclined with respect to the upper surface 50a of the substrate 50 as long as the lateral surfaces serve as surfaces through which light emitted from the light-emitting element 5 enters the light guide member 30. In the case in which the first to fourth lateral surfaces 35b1 to 35b4 defining the first recess 35 are inclined with respect to the upper surface 50a of the substrate 50, an inclination angle φ1 of the first to fourth lateral surfaces 35b1 to 35b4 with respect to the upper surface 50a is, for example, 70° or more and 90° or less. In the case in which the first to fourth lateral surfaces 35b1 to 35b4 of the first recess 35 are curved, the inclination angle φ1 is defined as an angle between a straight line connecting the upper end and the lower end of each of the first to fourth lateral surfaces 35b1 to 35b4 and the upper surface 50a of the substrate 50. The lower ends of the first to fourth lateral surfaces 35b1 to 35b4 preferably lie in the same plane as the upper surface 50a of the substrate 50. This structure allows for increasing the ratio of light emitted from the light-emitting element 5 incident on the first to fourth lateral surfaces 35b1 to 35b4 of the first recess 35.

The first recesses 31 to 39 formed to provide the surfaces through which light emitted from the light-emitting element 5 enters the light guide member 30, and accordingly the first recesses 31 to 39 may have other appropriate shape as long as serving as the surfaces through which light emitted from the light-emitting element 5 enters the light guide member 30. For example, the first recesses 31 to 39 may have a circular cylinder shape, a circular cone shape, a substantially prism shape having n corners, a substantially pyramid shape having n corners, or a spherical shape.

Second Recess

The second recess 40 extending over adjacent mounting areas is also a recess defined in the lower surface 30b of the light guide member 30. The second recess 40 is formed over the boundaries between adjacent mounting areas. A single unit second recess, which is a portion of the second recess, is formed for two adjacent mounting areas. For example, the second recess 40 includes 12 unit second recesses 401 to 412 formed over all the boundaries between adjacent mounting areas as shown in FIG. 2. The unit second recess 401 extends over the mounting area 51 and the mounting area 52, the unit second recess 402 extends over the mounting area 52 and the mounting area 53, and the unit second recess 403 extends over the mounting area 51 and the mounting area 54 as shown in FIG. 2. The unit second recesses 404 to 412 also extend over adjacent mounting areas in order as shown in FIG. 2. In the light source device 100 according to the present embodiment, the unit second recesses 401 to 412 communicate with each other to constitute the annular portions surrounding the respective first recesses 31 to 39.

The expression "the annular portions surrounding the first recesses" as used herein encompasses not only the structure in which the annular portions entirely surround all of four sides of each first recess, but rather also encompasses, for example, a structure in which the annular portions surround ½ or more of four sides of each first. The first recess 31, which is an outermost one of the three-by-three matrix of the first recesses 31 to 39, will be described below as an example. The first recess 31 is surrounded by the annular portion 421 composed of the unit second recess 401 extending over the mounting area 51 and the mounting area 52 and the unit second recess 403 extending over the mounting area 51 and the mounting area 54, so that ½ of four sides of the first recess 31 is surrounded by the annular portion 421.

The light-emitting elements 1 to 9 may be rotated about the respective central points in a top view as described above, so that the degree of "surrounding of the first recess by the annular portion" can vary according to the degree of rotation of each light-emitting element. Hence, as for the light source device according to certain embodiments of the present invention, the expression "the annular portion surrounds the first recess" also includes a configuration in which the annular portion surrounds ¼ of four sides of the first recess.

Further, with the unit second recesses 401 to 412 each formed above the boundary between two adjacent mounting areas, among two adjacent mounting areas over which each unit second recess extends, a single unit second recess is included in an annular portion surrounding the first recess in one of the two adjacent mounting areas and is also included in an annular portion surrounding the first recess in the other of the two adjacent mounting areas. The unit second recess 401 between the mounting area 51 and the mounting area 52 will be described below as an example. The unit second recess 401 is included in the annular portion 421 surrounding the first recess 31 in the mounting area 51 and is also included in the annular portion 422 surrounding the first recess 32 in the mounting area 52. Similarly, the unit second recess 404 between the mounting area 52 and the mounting area 55 is included in the annular portion 422 surrounding the first recess 32 in the mounting area 52 and is also included in the annular portion 425 surrounding the first recess 35 in the mounting area 55.

Accordingly, the unit second recesses constituting the annular portions surrounding the respective first recesses 31 to 39 have a structure as described below. The first recess 31 (33, 37, or 39), which is an outermost one of the three-by-three matrix of the first recesses, the first recess 35 located at the center, and the other first recess 32 (34, 36, or 38) will be separately described.

The annular portion surrounding the first recess 31 (33, 37, or 39), which is an outermost one of the three-by-three matrix of the first recesses, is constituted of the unit second recess 401 (405, 408, or 412) and the unit second recess 403 (402, 411, or 410).

The annular portion surrounding the first recess 35 located at the center of the three-by-three matrix of the first recesses is constituted of the unit second recess 404, the unit second recess 406, the unit second recess 407, and the unit second recess 409.

The annular portion surrounding the other first recess 32 (34, 36, or 38) of the three-by-three matrix is constituted of the unit second recess 401 (408, 405, or 412), the unit second recess 402 (403, 410, or 411), and the unit second recess 404 (406, 407, or 409).

The unit second recesses constituting the annular portions surrounding respective first recesses may not communicate with each other but may be independent recesses.

Each of the 12 unit second recesses 401 to 412 is a recess having a substantially triangular cross-sectional shape and defined by two surfaces. Referring to FIG. 5, the unit second recess 406 surrounding the first recess 35 located at the center will be described below as an example of the shape of the unit second recesses. The unit second recess 406 is defined by inner surfaces including a first surface 406a and a second surface 406b. The unit second recess 406 has a substantially triangular cross-sectional shape as shown in FIG. 5. The first surface 406a corresponds to a first element-lateral-surface 4b1 of the light-emitting element 4 and faces a first lateral surface 34b1 of the first recess 34 across the light guide member 30. The second surface 406b corresponds to a third element-lateral-surface 5b3 of the light-emitting element 5 and faces a third lateral surface 35b3 defining the first recess 35 across the light guide member 30.

Light that has been emitted from the first element-lateral-surface 4b1 of the light-emitting element 4 and entered the light guide member 30 through the inner surface defining the first recess 34 is mainly reflected at the first surface 406a defining the unit second recess 406. Similarly, light that has been emitted from the third element-lateral-surface 5b3 of the light-emitting element 5 and entered the light guide member 30 through the inner surface defining the first recess 35 is mainly reflected at the second surface 406b defining the unit second recess 406.

The two surfaces defining the inner surfaces defining the unit second recess may be flat or curved and may be orthogonal to or inclined with respect to the upper surface 50a of the substrate 50 as long as serving as surfaces that reflect light that has entered the light guide member 30 through the inner surfaces defining the first recess. In the case in which the surfaces defining the unit second recess are inclined with respect to the upper surface 50a of the substrate 50, an inclination angle φ2 the surfaces defining the unit second recess with respect to the upper surface 50a is, for example, 40° or more and 70° or less. In the case in which the surfaces defining the unit second recess are curved, the inclination angle φ2 is determined as an angle between a straight line connecting the upper end and the lower end of each of the first surface 406a and the second surface 406b and the upper surface 50a of the substrate 50. The lower ends of first surface 406a and the second surface 406b preferably lie in the same plane as the upper surface 50a of the substrate 50. This structure allows for increasing the ratio of light emitted from the light-emitting element 4 incident on the first surface 406a.

Similarly, the other unit second recesses 401 to 405 and 406 to 412 have a substantially triangular cross-sectional shape and are defined by inner surfaces including two surfaces. The surfaces defining each unit second recess reflect incident light in different directions (toward different illumination areas), and the inclination angles φ2 of the two surfaces defining each unit second recess can be different from each other according to the positional relationships between the mounting areas and the illumination areas.

In the present embodiment, the nine mounting areas and the nine illumination areas are in the point-symmetrical positional relationships. Accordingly, the unit second recesses 404, 406, 407, and 409 have the same inclination angle and shape of the first surfaces, and have the same inclination angle and shape of the second surfaces. Further, the unit second recesses 401 to 403, 405, 408, and 410 to 412 have the same inclination angle and shape of the first surfaces, and have the same inclination angle and shape of the second surfaces.

The unit second recesses are formed to provide the surfaces that reflect light that has entered the light guide member 30 through the inner surfaces defining the first recesses, and accordingly the unit second recesses may have, for example, a circular cylinder shape, a circular cone shape, a substantially prism having n corners, a substantially pyramid shape having n corners, or a spherical shape as long as serving as surfaces that reflect light that has entered the light guide member 30 through the inner surfaces defining the first recesses.

Distribution of Light from Light-Emitting Element

As described above, the light source device 100 according to the present embodiment irradiates desired illumination areas with light emitted from the respective light-emitting elements 1 to 9 using reflection at the inner surfaces defining the unit second recesses constituting the second recess, and the surfaces defining the unit second recesses correspond to the respective element-lateral-surfaces of the light-emitting elements 1 to 9.

Each surface defining the unit second recesses has a predetermined light distribution characteristic, and each predetermined light distribution characteristic is determined such that light from emission element-lateral-surfaces of the corresponding light-emitting element can illuminate the same illumination area. That is, a single light-emitting element emits light in four directions through the first to fourth element-lateral-surfaces, but the beams of light emitted in the different directions are condensed onto the same illumination area according to the predetermined light distribution characteristics of the surfaces defining the unit second recesses corresponding to the respective element-lateral-surfaces.

As has already been described, the predetermined light distribution characteristic depends on the shape of the surface defining the unit second recess, and also depends on the difference in refractive index between the light guide member 30 and the medium in contact with the light guide member 30. Further, light that has been refracted at the inner surface defining the first recess is incident on a surface defining the unit second recess, which depends on the shapes of the inner surfaces defining the first recesses 31 to 39 and the difference in refractive index between the light guide member 30 and the medium in contact with the light guide member 30.

FIG. 6A is a schematic cross-sectional view of the light source device 100 taken along the line A-A of FIG. 2 and shows emission of light emitted from the light-emitting elements 1 to 9 out of the light guide member 30 via the inner surfaces defining the first recesses and the surfaces defining the unit second recesses included in the second recess.

Distribution characteristics of light emitted from each of the light-emitting elements 1 to 9 will be more specifically described below referring to FIG. 6A.

Distribution of Light from Light-Emitting Element 5

As shown in FIG. 6A, light emitted from the first element-lateral-surface 5b1 of the light-emitting element 5 is mainly incident on the first lateral surface 35b1 of the first recess 35 facing the first element-lateral-surface 5b1, is refracted at the first lateral surface 35b1 of the first recess 35, and travels toward a first surface 407a of the unit second recess 407 corresponding to the first element-lateral-surface 5b1. Light incident on the first surface 407a of the unit second recess 407 is reflected at the first surface 407a of the unit second recess 407 and travels toward the upper surface 30a of the light guide member 30. Light incident on the upper surface 30a of the light guide member 30 is refracted at the upper surface 30a of the light guide member 30, and is then emitted out of the light guide member 30 to illuminate the illumination area 65 corresponding to the mounting area 55 in which the light-emitting element 5 is disposed.

Similarly, light emitted from the other three element-lateral-surfaces, that is, the second to fourth element-lateral-surfaces 5b2 to 5b4, is mainly incident on the second to fourth lateral surfaces 35b2 to 35b4 defining the first recess 35 facing the respective second to fourth element-lateral-surfaces 5b2 to 5b4 is refracted at the second to respective fourth lateral surfaces 35b2 to 35b4 that define the first recess 35, and travels toward the surfaces defining the unit second recesses corresponding to the second to respective fourth element-lateral-surfaces 5b2 to 5b4. Light incident on the surfaces defining the unit second recesses is reflected at the surfaces defining the unit second recesses and travels toward the upper surface 30a of the light guide member 30. Light incident on the upper surface 30a of the light guide member 30 is refracted at the upper surface 30a of the light guide member 30 and then emitted out of the light guide member 30 to illuminate the illumination area 65 corresponding to the mounting area 55 in which the light-emitting element 5 is disposed. While the light-emitting element 5 emits light through the element-lateral-surfaces in different directions, the light distribution characteristics of the surfaces defining the unit second recesses corresponding to respective element-lateral-surfaces of the light-emitting element 5 are determined such that light emitted from element-lateral-surfaces of the light-emitting element 5 illuminates the same illumination area 65.

In the light source device 100 according to the present embodiment, the illumination area 65 is located directly above the mounting area 55, so that all the surfaces defining the unit second recesses corresponding to the first to fourth element-lateral-surfaces 5b1 to 5b4 of the light-emitting element 5 can be designed so as to have the same light distribution characteristic.

Distribution of Light from Light-Emitting Element 4

Emission of light emitted from the light-emitting element 4 (2, 6, or 8) via the inner surfaces defining the first recess and the surfaces defining the unit second recesses included in the second recess will be described referring to FIG. 6A.

A third element-lateral-surface 4b3 of the light-emitting element 4 opposite to the first element-lateral-surface 4b1 faces the outer peripheral surface of the light guide member 30. The first recess 34 covering the light-emitting element 4 also has inner surfaces including first to fourth lateral surfaces 34b1 to 34b4 facing respective first to fourth element-lateral-surfaces 4b1 to 4b4 of the light-emitting element 4.

Light emitted from the first element-lateral-surface 4b1 of the light-emitting element 4 is mainly incident on the first lateral surface 34b1 of the first recess 34 facing the first element-lateral-surface 4b1, is refracted at the first lateral surface 34b1 of the first recess 34, and travels toward the first surface 406a of the unit second recess 406 corresponding to the first element-lateral-surface 4b1. Light incident on the first surface 406a of the unit second recess 406 is reflected at the first surface 406a of the unit second recess 406 and travels toward the upper surface 30a of the light guide member 30. Light incident on the upper surface 30a of the light guide member 30 is refracted again at the upper surface 30a of the light guide member 30 and then emitted out of the light guide member 30 to illuminate the corresponding illumination area 64.

Similarly, light emitted from the second element-lateral-surface 4b2 and the fourth element-lateral-surface 4b4 of the light-emitting element 4 is mainly incident on the second lateral surface 34b2 and the fourth lateral surface 34b4 of the first recess 34 facing the second element-lateral-surface 4b2 and the respective fourth element-lateral-surface 4b4 is refracted at the second lateral surface 34b2 and the respective fourth lateral surface 34b4 defining the first recess 34 and travels toward the surfaces defining the unit second recesses. Light incident on the surfaces defining the unit second recesses is reflected at the surfaces defining the unit second recesses and travels toward the upper surface 30a of the light guide member 30. Light incident on the upper surface 30a of the light guide member 30 is refracted at the upper surface 30a of the light guide member 30 and then emitted out of the light guide member 30 to illuminate the illumination area 64 corresponding to the mounting area 54 in which the light-emitting element 4 is disposed.

In the light source device 100 according to the present embodiment, the third element-lateral-surface 4b3 of the light-emitting element 4 is located close to the outer peripheral surface of the light guide member 30, such that spaces sufficient for providing surfaces for reflecting light emitted from the third element lateral surface 4b3 cannot be created in the light guide member 30. That is, the light source device 100 according to the present embodiment does not have a space constituting a unit second recess between the third element-lateral-surface 4b3 of the light-emitting element 4 and the outer peripheral surface of the light guide member 30, and does not have a surface that reflects light emitted from the third element-lateral-surface 4b3.

However, the light guide member 30 may include an additional unit second recess defined by a surface that reflects light emitted from the third element-lateral-surface 4b3, with substantially the same configuration as described above according to the spatial size between the third element-lateral-surface 4b3 of the light-emitting element 4 and the outer peripheral surface of the light guide member 30. In the case in which a surface that reflects light emitted from the third element-lateral-surface 4b3 is provided, light reflected at this surface is also emitted out of the light guide member 30 through the upper surface 30a, and illuminates the illumination area 64 similarly to light emitted from the first element-lateral-surface 4b1, the second element-lateral-surface 4b2, and the fourth element-lateral-surface 4b4. The light distribution characteristics of the surfaces that reflect light emitted from the respective element-lateral-surfaces are determined such that the same illumination area 64 is illuminated, while light is emitted from the element-lateral-surfaces of the light-emitting element 4 in different directions.

A reflecting member may be disposed to cover the third element-lateral-surface 4b3 of the light-emitting element 4. With this structure, light emitted from the third element-lateral-surface 4b3 is reflected at the reflecting member, and is emitted from one or more of the first element-lateral-surface 4b1, the second element-lateral-surface 4b2, and the fourth element-lateral-surface 4b4 to illuminate the illumination area 64.

As for the light source device 100 according to the present embodiment, the mounting area 54 in which the light-emitting element 4 is disposed is located at a position that is point-symmetrical to the illumination area 64 with respect to the point O, and the light source device 100 has a symmetrical structure with respect to a plane containing the center of the light-emitting element 4, the point O, and the center of the illumination area 64. Accordingly, the surface defining the unit second recess corresponding to the second element-lateral-surface 4b2 of the light-emitting element 4 and the surface defining the unit second recess corresponding to the fourth element-lateral-surface 4b4 can be designed so as to have the same light distribution characteristic. The surface defining the unit second recess corresponding to the first element-lateral-surface 4b1 of the light-emitting element 4 is designed so as to have a light distribution characteristic different from the light distribution characteristics of the surface defining the unit second recess corresponding to the second element-lateral-surface 4b2 and the surface defining the unit second recess corresponding to the fourth element-lateral-surface 4b4.

Distribution of Light from Light-Emitting Element 1

Figure 6B:
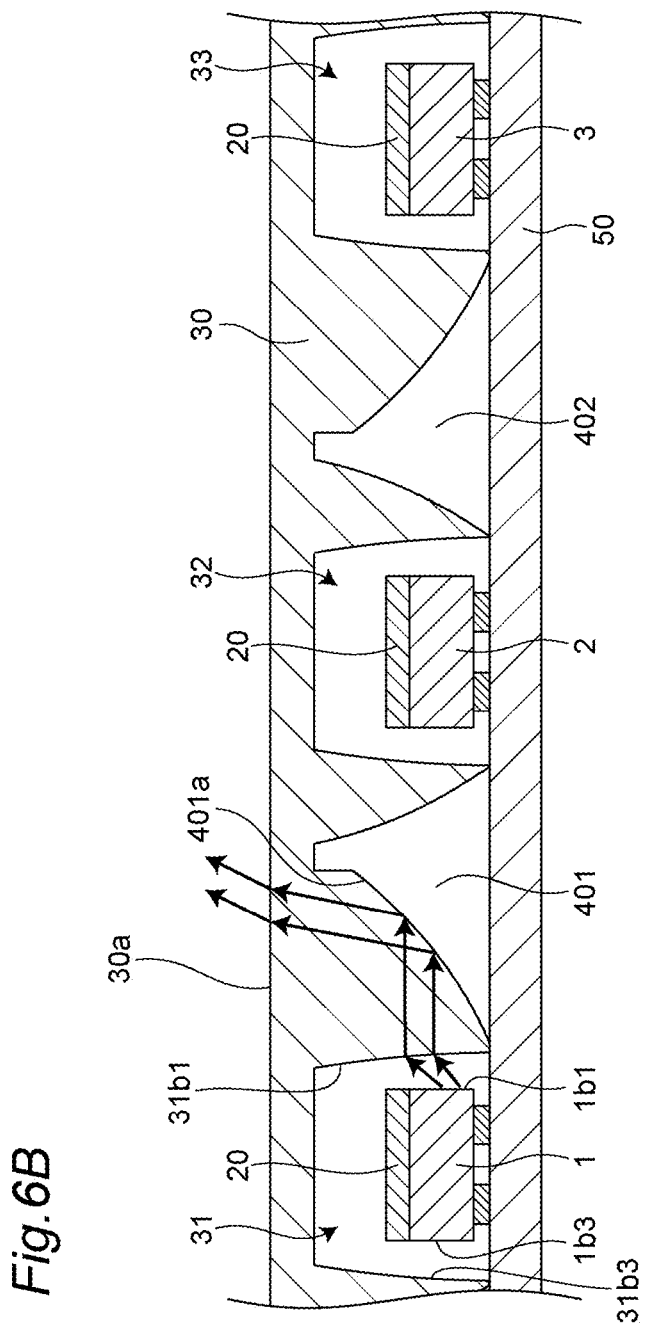
FIG. 6B is a schematic cross-sectional view of the light source device taken along the line B-B of FIG. 2, showing traveling of light.

Next, emission of light emitted from the light-emitting element 1 (3, 7, or 9) via the inner surfaces defining the first recess and the surfaces defining the unit second recesses included in the second recess will be described referring to FIG. 6B. FIG. 6B is a schematic cross-sectional view of the light source device 100 taken along the line B-B of FIG. 2 and shows emission of light emitted from the light-emitting element out of the light guide member 30 via the inner surface defining the first recess and the surface defining the unit second recess constituting the second recess.

A third element-lateral-surface 1b3 and a fourth element-lateral-surface 1b4 of the light-emitting element 1 face the outer peripheral surface of the light guide member 30 as shown in FIG. 2. The first recess 31 covering the light-emitting element 1 is also defining inner surfaces including first to fourth lateral surfaces 31b1 to 31b4 facing the respective first to fourth element-lateral-surfaces 1b1 to 1b4 of the light-emitting element 1.

As shown in FIG. 6B, light emitted from the first element-lateral-surface 1b1 of the light-emitting element 1 is mainly incident on the first lateral surface 31b1 of the first recess 31 facing the first element-lateral-surface 1b1, is refracted at the first lateral surface 31b1 of the first recess 31, and travels toward a first surface 401a of the unit second recess 401 corresponding to the first element-lateral-surface 1b1. Light incident on the first surface 401a of the unit second recess 401 is reflected at the first surface 401a of the unit second recess 401 and travels toward the upper surface 30a of the light guide member 30. Light incident on the upper surface 30a of the light guide member 30 is refracted at the upper surface 30a of the light guide member 30 and then emitted out of the light guide member 30 to illuminate the illumination area 61 corresponding to the mounting area 51 on which the light-emitting element 1 is disposed.

Similarly, light emitted from the second element-lateral-surface 1b2 of the light-emitting element 1 is mainly incident on the second lateral surface 31b2 of the first recess 31 corresponding to the second element-lateral-surface 1b2, is refracted at the second lateral surface 31b2 of the first recess 31, and travels toward the surface defining the unit second recess facing the second element-lateral-surface 1b2. Light incident on the surface defining the unit second recess is reflected at the surface defining the unit second recess and travels toward the upper surface 30a of the light guide member 30. Light incident on the upper surface 30a of the light guide member 30 is refracted at the upper surface 30a of the light guide member 30 and is then emitted out of the light guide member 30 to illuminate the illumination area 61 corresponding to the mounting area 51 on which the light-emitting element 1 is disposed.

The third element-lateral-surface 1b3 and the fourth element-lateral-surface 1b4 of the light-emitting element 1 are located close to the outer peripheral surface of the light guide member 30 in the light source device 100 of the present embodiment, such that spaces sufficient for providing surfaces for reflecting light emitted from the third element-lateral-surface 1b3 and the fourth element-lateral-surface 1b4 cannot be created in the light guide member 30. That is, the light source device 100 according to the present embodiment does not have spaces constituting unit second recesses between the third element-lateral-surface 1b3 of the light-emitting element 1 and the outer peripheral surface of the light guide member 30 and between the fourth element-lateral-surface 1b4 and the outer peripheral surface of the light guide member 30, and does not have surfaces that reflect light emitted from the third element-lateral-surface 1b3 and the fourth element-lateral-surface 1b4.

However, unit second recesses may be formed between the third element-lateral-surface 1b3 of the light-emitting element 1 and the outer peripheral surface of the light guide member 30 and between the fourth element-lateral-surface 1b4 and the outer peripheral surface of the light guide member 30 to provide surfaces that reflect light emitted from the third element-lateral-surface 1b3 and the fourth element-lateral-surface 1b4 with substantially the same configuration according to the spatial sizes between the third and fourth element-lateral-surfaces 1b3 and 1b4 and the outer peripheral surface of the light guide member 30. In the case in which surfaces that reflect light emitted from the third element-lateral-surface 1b3 and the fourth element-lateral-surface 1b4 are provided, light reflected at these surfaces is also emitted out of the light guide member 30 through the upper surface 30a, and light emitted from the third element-lateral-surface 1b3 and the fourth element-lateral-surface 1b4 illuminates the illumination area 61 similarly to light emitted from the first element-lateral-surface 1b1 and the second element-lateral-surface 1b2. The light distribution characteristics of the surfaces each of which reflects light emitted from a corresponding one of the element-lateral-surfaces are determined such that the same illumination area 61 is illuminated while light is emitted from the element-lateral-surfaces of the light-emitting element 1 in different directions.

A reflecting member covering the third element-lateral-surface 1b3 and the fourth element-lateral-surface 1b4 may be disposed. With this structure, light emitted from the third element-lateral-surface 1b3 and the fourth element-lateral-surface 1b4 is reflected by the reflecting member and emitted from the first element-lateral-surface 1b1 and/or the second element-lateral-surface 1b2 to illuminate the illumination area 61.

In the light source device 100 according to the present embodiment, the mounting area 51 on which the light-emitting element 1 is disposed is located at a position point-symmetrical to the illumination area 61 with respect to the point O, and the light source device 100 has a symmetrical structure with respect to a plane containing the center of the light-emitting element 1, the point O, and the center of the illumination area 61. Accordingly, the surface defining the unit second recess corresponding to the first element-lateral-surface 1b1 of the light-emitting element 1 and the surface defining the unit second recess corresponding to the second element-lateral-surface 1b2 can be designed so as to have the same light distribution characteristic.

2. Variations

First Modification

While the case in which all the light-emitting elements are oriented in the same direction has been described above, the light-emitting elements may be rotated about the centers of the light-emitting elements, as has already been described.

For example, with respect to the light-emitting element 5 located at the center of the matrix of the plurality of light-emitting elements in three rows and three columns, in the case in which the other light-emitting elements 1 to 4 and 6 to 9 are rotated through respective rotation angles $\theta_a$ to $\theta_h$ with respect to the light-emitting element 5, where $0° \le (\theta_a$ to $\theta_h) < 360°$, all of the nine light-emitting elements 1 to 9 are oriented in the same direction when all of $\theta_a$ to $\theta_h = 0°$. For example, when $\theta_a$, $\theta_c$, $\theta_f$, and $\theta_h = 0°$ and $\theta_b$, $\theta_d$, $\theta_e$, and $\theta_g = 45°$, the light-emitting elements 1, 3, 7, and 9 are oriented in the same direction as the light-emitting element 5, and the light-emitting elements 2, 4, 6, and 8 are rotated through 45° with respect to the light-emitting element 5.

In another example in which the light-emitting elements each have a square shape in a top view, all the relations $\theta_x$ (x=a to h)=0°, $\theta_x$ (x=a to h)=90°, $\theta_x$ (x=a to h)=180°, and $\theta_x$ (x=a to h)=270° indicate that the central light-emitting element 5 and a light-emitting element x (x=1 to 4 and 6 to 9) are oriented in the same direction.

In the case in which the light-emitting elements are rotated as described above, the light guide member may include spaces for unit second recesses corresponding to the element-lateral-surfaces of the light-emitting elements facing the outer peripheral surface of the light guide member can be included according to the rotation angles.

A light source device 200 according to a first variation differs from the light source device 100 according to the embodiment described above in the rotational arrangement of the light-emitting elements 2, 4, 6, and 8 and the shapes of the unit second recesses. Structures of the light source device 200 that are different from those of the light source device 100 will be described below.

Figure 7A:
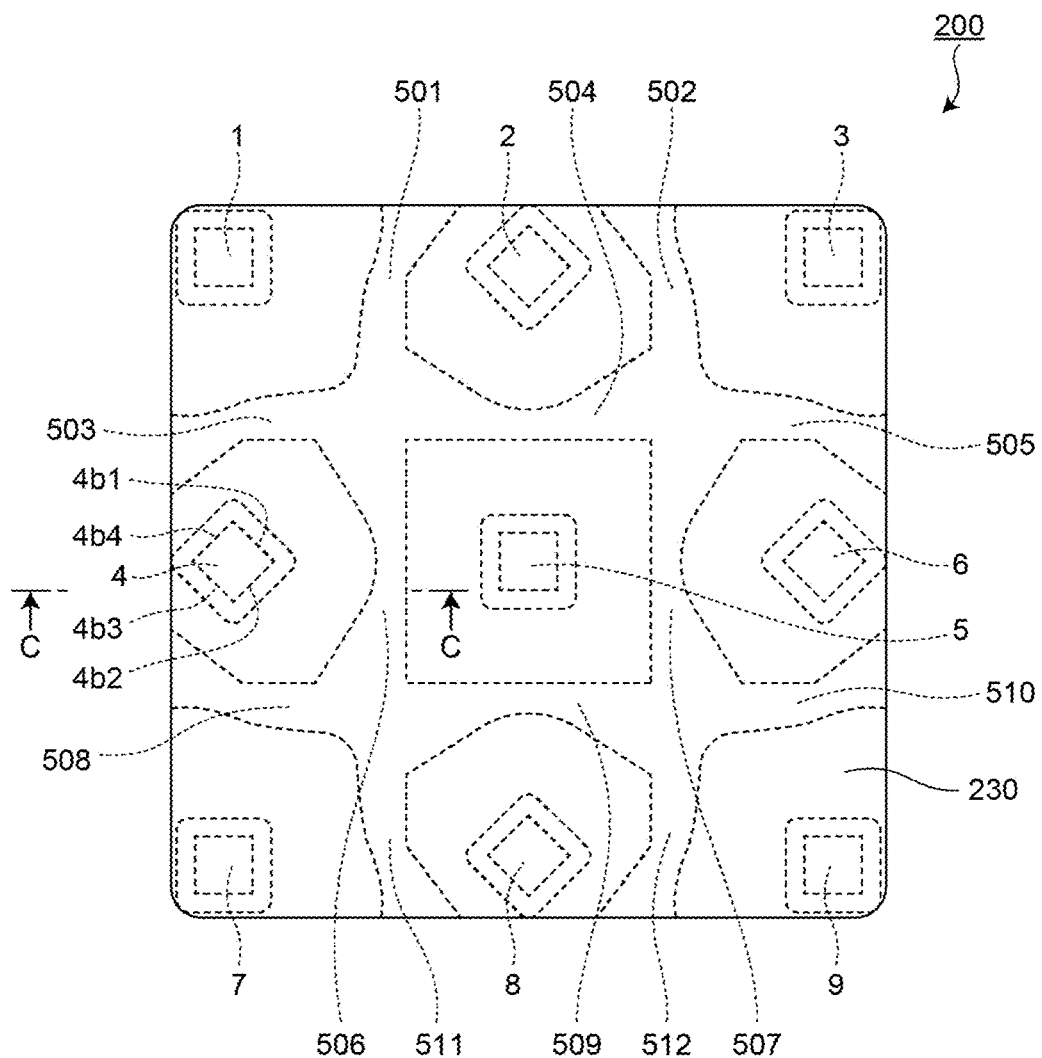
FIG. 7A is a schematic top view of a light source device according to a variation of the present invention.

In the light source device 200 according to the first variation, with respect to the light-emitting element 5, the light-emitting elements 1, 3, 7, and 9 are rotated through angles $\theta_a$, $\theta_c$, $\theta_f$, and $\theta_h = 0°$, and the light-emitting elements 2, 4, 6, and 8 are rotated through angles $\theta_b$, $\theta_d$, $\theta_e$, and $\theta_g = 45°$, as shown in FIG. 7A. As described below, unit second recesses 501 to 512 of the light source device 200 have a shape including surfaces for reflecting light emitted from the respective rotated light-emitting elements 2, 4, 6, and 8 and incident on the light guide member through the inner surfaces defining the first recesses to allow light to illuminate the respective illumination areas 62, 64, 66, and 69 through the upper surface of the light guide member.

Emission of light emitted from the light-emitting element 4 (2, 6, or 8) via the inner surfaces defining the first recess and the surfaces defining the unit second recesses constituting the second recess will be described referring to FIG. 7B.

Figure 7B:
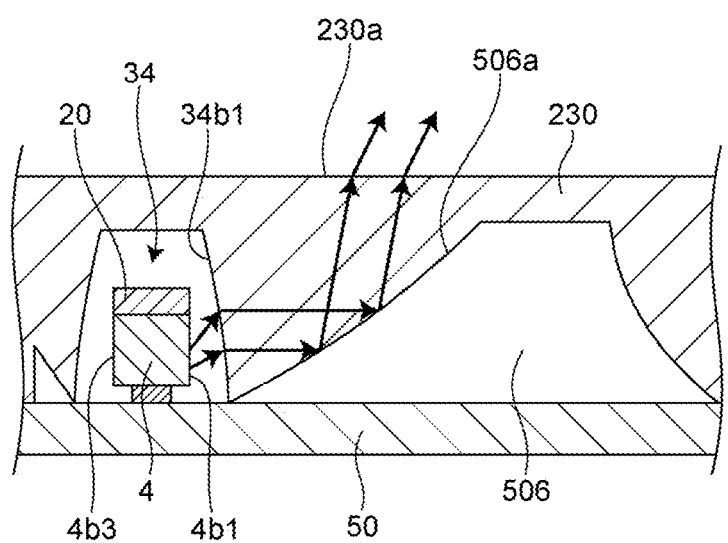
FIG. 7B is a schematic cross-sectional view of the light source device taken along the line C-C of FIG. 7A, showing traveling of light.

FIG. 7B is a schematic cross-sectional view of the light source device 200 taken along line C-C of FIG. 7A and shows emission of light emitted from the light-emitting element out of a light guide member 230 via the inner surface defining the first recess and the surface defining the unit second recess constituting the second recess. Emission of light from the other light-emitting elements 1, 3, 5, 7, and 9 is substantially the same as in the embodiment described above, and its detailed description will be omitted.

As shown in FIG. 7A, the third element-lateral-surface 4b3 and the fourth element-lateral-surface 4b4 of the light-emitting element 4 are oriented toward the outer peripheral surface of the light guide member 230.

As shown in FIG. 7B, light emitted from the first element-lateral-surface 4b1 of the light-emitting element 4 is mainly incident on the first lateral surface 34b1 of the first recess 34 corresponding to the first element-lateral-surface 4b1, is refracted at the first lateral surface 34b1 of the first recess 34, and travels toward a first surface 506a of the unit second recess 506 corresponding to the first element-lateral-surface 4b1. Light incident on the first surface 506a of the unit second recess 506 is reflected at the first surface 506a of the unit second recess 506 and travels toward an upper surface 230a of the light guide member 230. Light incident on the upper surface 230a of the light guide member 230 is refracted at the upper surface 230a of the light guide member 230 and is then emitted out of the light guide member 230 to illuminate the illumination area 64 corresponding to the mounting area 54 on which the light-emitting element 4 is disposed.

Similarly, light emitted from the second to fourth element-lateral-surfaces 4b2 to 4b4 of the light-emitting element 4 is mainly incident on the second to fourth lateral surfaces of the first recess 34 facing the respective second to fourth element-lateral-surfaces 4b2 to 4b4, is refracted at the second to respective fourth lateral surfaces of the first recess 34, and travels toward the corresponding surfaces defining the unit second recesses. Light incident on the surfaces defining the unit second recesses is reflected at the surfaces defining the unit second recesses and travels toward the upper surface 230a of the light guide member 230. Light incident on the upper surface 230a of the light guide member 230 is refracted at the upper surface 230a of the light guide member 230 and then emitted out of the light guide member 230 to illuminate the illumination area 64 corresponding to the mounting area 54 on which the light-emitting element 4 is disposed. The light-emitting element 4 emits light through the first to fourth element-lateral-surfaces 4b1 to 4b4 in different directions, but the light distribution characteristics of the surfaces defining the unit second recesses corresponding to the respective first to fourth element-lateral-surfaces 4b1 to 4b4 are determined such that the same illumination area 64 is illuminated.

The mounting area 54, on which the light-emitting element 4 is disposed, of the light source device 200 is located at a position point-symmetrical to the illumination area 64 with respect to a single point, and the light source device 200 has a symmetrical structure with respect to a plane containing the center of the light-emitting element 4, the single point, and the center of the illumination area 64. In the case in which the light-emitting element 4 has a square shape in a top view, with the light-emitting element 4 rotated through $\theta_d=45°$, a surface defining the unit second recess corresponding to the first element-lateral-surface 4b1 of the light-emitting element 4 and a surface defining the unit second recess corresponding to the second element-lateral-surface 4b2 can be designed so as to have the same light distribution characteristic, and a surface defining the unit second recess corresponding to the third element-lateral-surface 4b3 and a surface defining the unit second recess corresponding to the fourth element-lateral-surface 4b4 can be designed so as to have the same light distribution characteristic. The light distribution characteristic of the surface defining the unit second recess corresponding to the first element-lateral-surface 4b1 and the surface defining the unit second recess corresponding to the second element-lateral-surface 4b2 differs from the light distribution characteristic of the surface defining the unit second recess corresponding to the third element-lateral-surface 4b3 and the surface defining the unit second recess corresponding to the fourth element-lateral-surface 4b4.

As described above, light emitted from all the first to fourth element-lateral-surfaces 4b1 to 4b4, of the light-emitting element 4 rotated through $\theta_d=45°$ can be used. That is, the light source device 200 can utilize a larger amount of light emitted from the light sources than the light source device 100 while having the same size as the size of the light source device 100.

Second Variation

Figure 8:
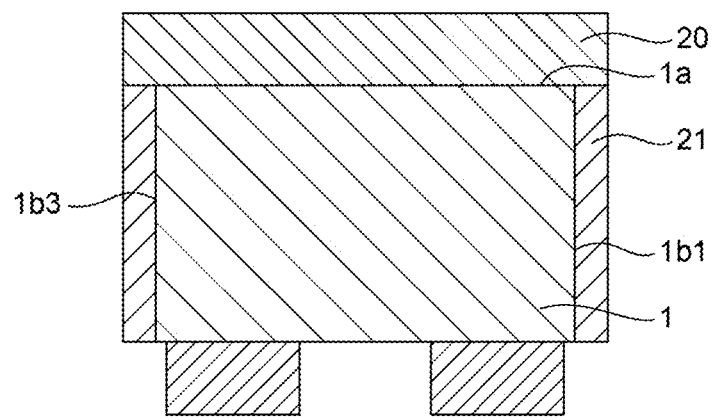
FIG. 8 schematically shows an example of a light-emitting element used in a light source device according to another variation of the present invention.

As shown in FIG. 8, a light source device according to a second variation differs from the light source device 100 according to the embodiment described above in that wavelength conversion members 21 are disposed over the element-lateral-surfaces of the light-emitting elements 1 to 9. In the light-emitting elements 1 to 4 and 6 to 9 provided with the light-shielding members 20, each of the light-shielding members 20 cover the upper surface of a respective one of the light-emitting elements and the upper surface of a respective one of the wavelength conversion members 21.

With the wavelength conversion members 21 covering the element-lateral-surfaces of the light-emitting elements 1 to 9, wavelengths of light irradiated to the illumination areas 61 to 69 can be adjusted to desired wavelengths.

Third Variation

Figure 9:
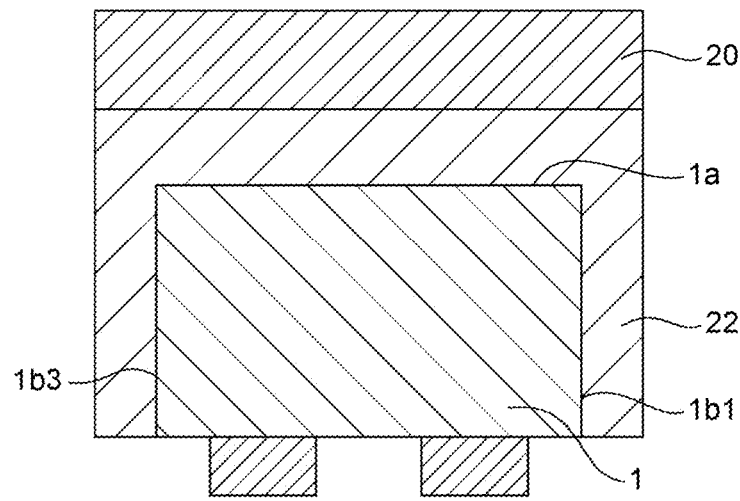
FIG. 9 schematically shows an example of a light-emitting element used in a light source device according to even another variation of the present invention.

A light source device according to a third variation differs from the light source device 100 according to the embodiment described above in that wavelength conversion members 22 are disposed to cover the upper surfaces and the element-lateral-surfaces of the light-emitting elements 1 to 9. In the light-emitting elements 1 to 4 and 6 to 9 provided with the light-shielding members 20, each of the wavelength conversion members 22 is disposed between the upper surface of a corresponding one of the light-emitting elements 1 to 4 and 6 to 9 and a corresponding one of the light-shielding members 20 and on the element-lateral-surfaces of the corresponding one of the light-emitting elements 1 to 4 and 6 to 9 as shown in FIG. 9.

With the wavelength conversion members 22 covering the upper surfaces and the element-lateral-surfaces of respective ones of the light-emitting elements, wavelengths of light irradiated to the illumination areas 61 to 69 can be adjusted to desired wavelengths.

Fourth Variation

Figure 10:
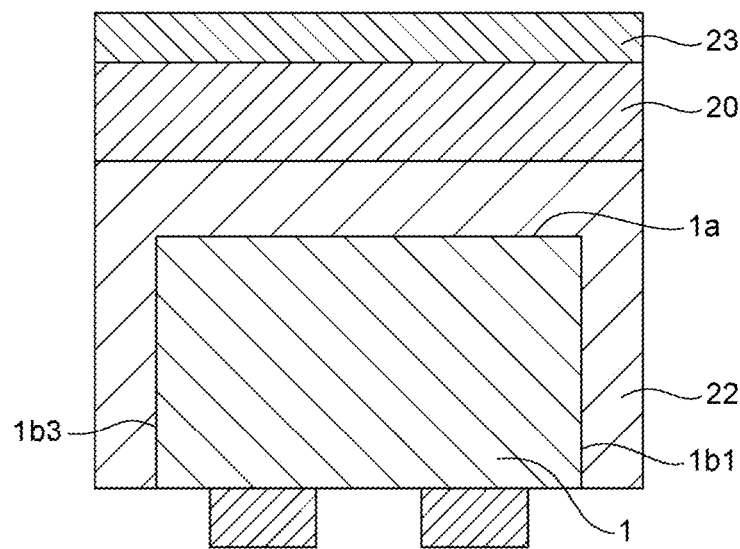
FIG. 10 schematically shows an example of a light-emitting element used in a light source device according to still another variation of the present invention.

A light source device according to a fourth variation differs from the light source device 100 according to the embodiment described above in including the wavelength conversion members 22 covering the upper surfaces and the element-lateral-surfaces of the light-emitting elements 1 to 9 and covering members 23 covering the upper surface of the light-emitting element 5 and the upper surfaces of the light-shielding members 20 of the light-emitting elements 1 to 4 and 6 to 9. In the light-emitting elements 1 to 4 and 6 to 9 provided with the light-shielding members 20, each of the wavelength conversion members 22 is disposed between the upper surface of a corresponding one of the light-emitting elements 1 to 4 and 6 to 9 and the light-shielding members 20 and on the element-lateral-surfaces of the corresponding one of the light-emitting elements 1 to 4 and 6 to 9 as shown in FIG. 10.

With the covering members 23 covering the upper surfaces of the wavelength conversion members 22 as described above, the light-emitting elements and/or the light-shielding members can be protected against external forces.

The color of the upper surface of each covering member 23 is desirably adjusted to a similar color to the color of the upper surface 50a of the substrate 50. The expression "similar color" as used herein refers to, in the Munsell color system (20 hues), (1) Hue: within three ranges in the hue circle, (2) Value: within three ranges, and (3) Chroma: within three ranges. That is, for example, colors of the same and both adjacent values and chromas in a constant hue plane in the Munsell color system (20 hues) are referred to as being "similar color."

The values of the upper surface of the covering member 23 and the upper surface of the substrate 50 are, for example, four or less in the Munsell color system.

With the upper surface of the covering member 23 and the upper surface 50a of the substrate 50 having similar colors, the color of appearance of the light source device 100 can be uniform, which can improve appearance as a product.

Fifth Variation

Figure 11:
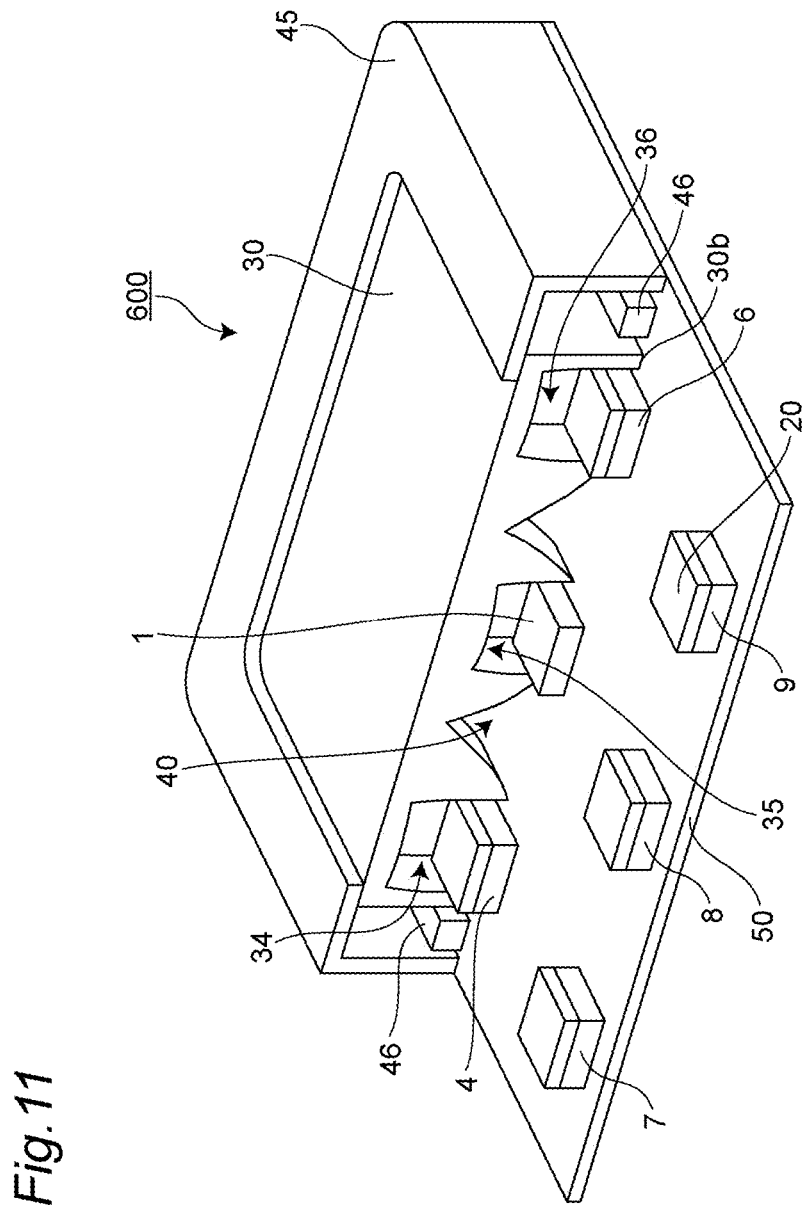
FIG. 11 is a schematic perspective view of a light source device according to yet another variation of the present invention.

A light source device 600 according to a fifth variation differs from the light source device 100 according to the embodiment described above in including a frame member 45 covering the lateral surfaces of the light guide member 30 as shown in FIG. 11. The frame member 45 covering the lateral surfaces of the light guide member 30 reflects light leaking from the lateral surfaces of the light guide member 30, so that light emitted from the light-emitting elements can be efficiently used. Further, for example, when the light source device according to one embodiment of the present invention is installed in an electronic device, the frame member 45 can be disposed to left a space between the frame member 45 and the lateral surfaces of the light guide member 30, which allows electronic components 46 to be disposed in the space between the frame member 45 and the lateral surfaces of the light guide member 30.

3. Example

An example will be described below.

In the example, an irradiation distribution on the irradiated surface was simulated using a model of the light source device according to the embodiment described above including the substrate, the nine light-emitting elements 1 to 9 configured to be discretely turned on, and the light guide member 30 defining the first recesses 31 to 39 and the second recess 40.

The wavelength of light emitted from the light-emitting elements 1 to 9 was set to 550 nm. The light-emitting elements 1 to 9 were arranged in a three-by-three matrix and were all set to the same orientation (θ=0°). The light-emitting elements 1 to 4 and 6 to 9, other than the light-emitting element 5 located at the center, were set to be provided with light-shielding members 20 on their upper surfaces. The material of the light-shielding members 20 was set to a silicone resin mixed with titanium oxide. The refractive index of the silicone resin was set to 1.51, and the refractive index of titanium oxide was set to 2.54. The titanium oxide content in the light-shielding members was set to 60 wt %. The unit "wt %" as used herein refers to percentage by weight and represents the proportion of the weight of titanium oxide to the total weight of the light-shielding members.

The first recesses 31 to 39 were set to have a substantially rectangular parallelepiped shape that has upper edges forming a substantially rectangular shape with sides of 0.9×0.9 mm in length, a substantially rectangular surface defining a bottom of the recess with sides of 1.04×1.04 mm in length, and a length of 0.8 mm between the upper surface and the surface defining a bottom of the recess. The inclination angles φ1 of the first to fourth lateral surfaces were all set to 85°.

The second recess 40 was set to be constituted of the 12 unit second recesses 401 to 412. Among the surfaces defining the unit second recesses 404, 406, 407, and 409, an inclination angle φ2 of the surfaces facing the first recess 35 was set to 56.5°, and an inclination angle φ2 of the other surfaces was set to 40°. Among the surfaces defining the unit second recesses 401 to 403, 405, 408, and 410 to 412, an inclination angle φ2 of the surfaces facing the first recess 31 (or 33, 37, or 39), which is an outermost first recess of the three rows and the three columns, was set to 40°, and an inclination angle φ2 of the other surfaces was set to 58°.

The material of the light guide member 30 was set to polycarbonate. The refractive index of polycarbonate was set to 1.58.

With respect to the model of the light source device produced as described above in the example, all or some of the light-emitting elements in the model of the light source device were turned on, and respective illuminance distributions on an irradiation plane 30 cm away from the model of the light source device were observed.

Figure 12A:
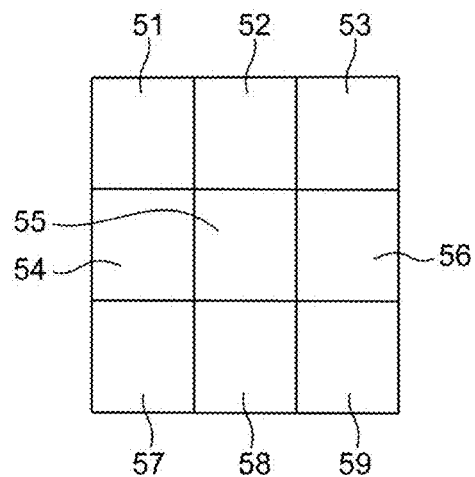

FIG. 12A schematically shows a lighting condition when all the nine light-emitting elements 1 to 9 were turned on.

Figure 12B:
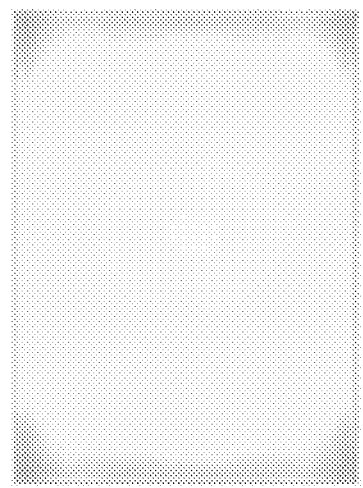
FIG. 12B schematically shows the illuminance distribution on the irradiated surface in the lighting condition shown in FIG. 12A.

FIG. 12B schematically shows the illuminance distribution on the irradiated surface in the lighting condition shown in FIG. 12A.

Figure 13A:
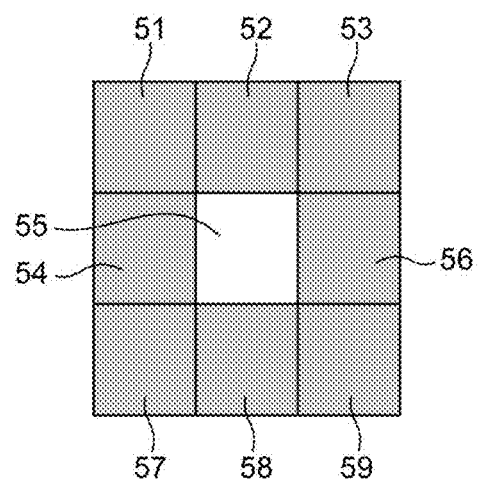
Figure 13B:
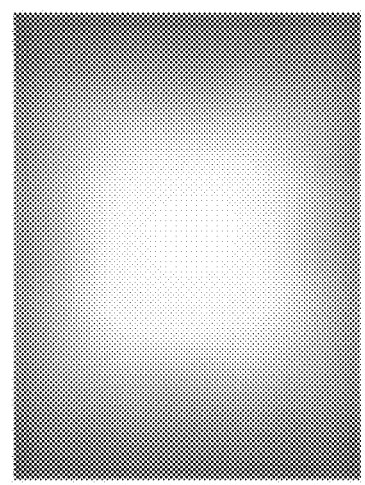
FIG. 13B schematically shows the illuminance distribution on the irradiated surface in the lighting condition shown in FIG. 13A.

FIG. 13A schematically shows a lighting condition when the single light-emitting element 5 disposed at the center among the nine light-emitting elements 1 to 9 was turned on. FIG. 13B schematically shows the illuminance distribution on the irradiated surface in the lighting condition shown in FIG. 13A.

Figure 14A:
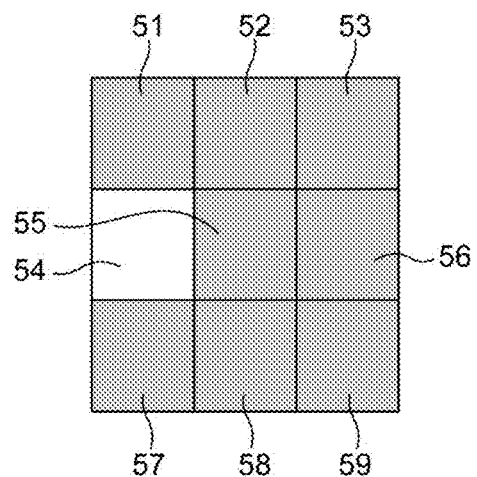
Figure 14B:
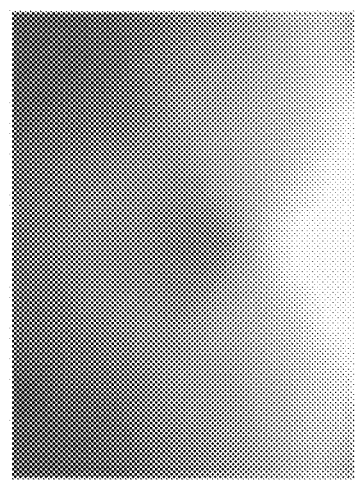
FIG. 14B schematically shows the illuminance distribution on the irradiated surface in the lighting condition shown in FIG. 14A.

FIG. 14A schematically shows a lighting condition in which the single light-emitting element 4 among the nine light-emitting elements 1 to 9 was turned on. FIG. 14B schematically shows the illuminance distribution on the irradiated surface in the lighting condition shown in FIG. 14A.

Figure 15A:
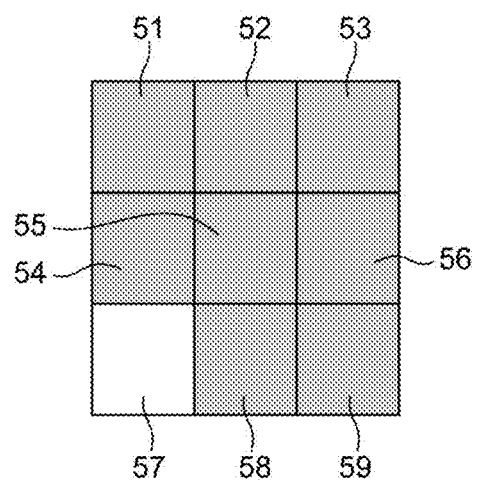
Figure 15B:
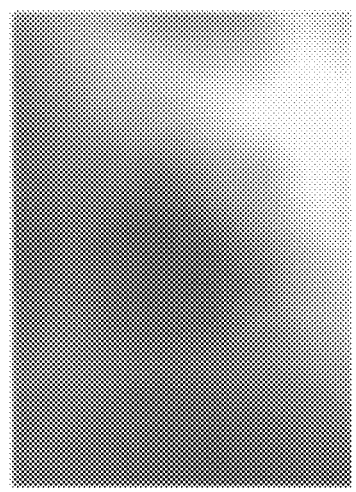
FIG. 15B schematically shows the illuminance distribution on the irradiated surface in the lighting condition shown in FIG. 15A.

FIG. 15A schematically shows a lighting condition in which the single light-emitting element 7 among the nine light-emitting elements 1 to 9 was turned on. FIG. 15B schematically shows the illuminance distribution on the irradiated surface in the lighting condition shown in FIG. 15A.

Figure 16A:
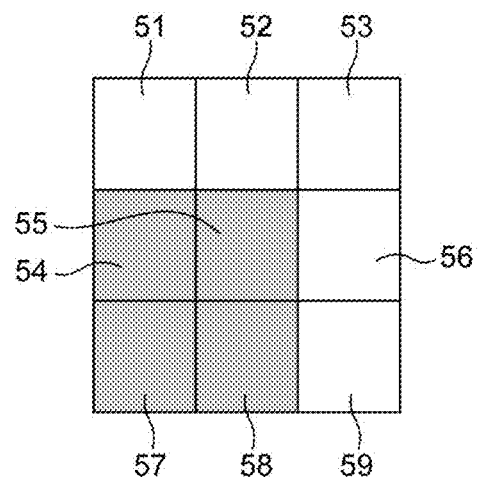
Figure 16B:
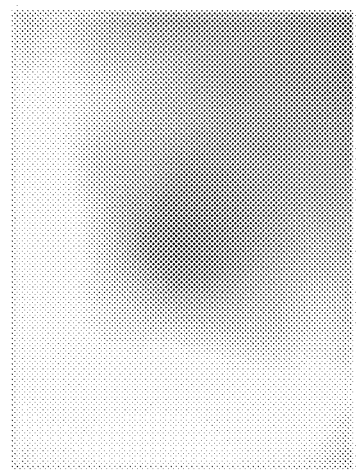
FIG. 16B schematically shows the illuminance distribution on the irradiated surface in the lighting condition shown in FIG. 16A.

FIG. 16A schematically shows a lighting condition in which the five light-emitting elements 1 to 3, 6, and 9 among the nine light-emitting elements 1 to 9 were turned on. FIG. 16B schematically shows the illuminance distribution on the irradiated surface in the lighting condition shown in FIG. 16A.

From the simulation results, it can be understood that the model of the light source device in the example can selectively illuminate desired illumination area(s) and that light emitted from the light sources can illuminate a large area.

The light source device according to certain embodiments of the present invention can illuminate a desired irradiation area and can therefore be preferably used for lighting apparatuses, flashes for cameras, headlights of vehicles, and the like. The light source device according to certain embodiments of the present invention may also be used for other appropriate applications.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light source device comprising:
    a substrate having an upper surface including a first mounting area, a second mounting area located at a first lateral side of the first mounting area, and a third mounting area located at a second lateral side of the first mounting area that is opposite the first lateral side;
    a plurality of light emitting elements including a first light-emitting element, a second light-emitting element, and a third light-emitting element disposed on the upper surface of the substrate;
    a plurality of light-shielding members, which include a first light-shielding member disposed on an upper surface of the second light-emitting element, and a second light-shielding member disposed on an upper surface of the third light-emitting element, wherein no light shielding member is disposed on an upper surface of the first light-emitting element;
    a light guide member having an upper surface and a lower surface, the light guide member defining, in the lower surface, a plurality of first recesses and at least one second recess; and
    a frame member covering lateral surfaces and a part of the upper surface of the light guide member, the frame member being configured to reflect light transmitted from the lateral surfaces of the light guide member;
    wherein the first light-emitting element is located on the first mounting area in a first of the first recesses, the second light-emitting element is located on the second mounting area in a second of the first recesses, and the third light-emitting element is located on the third mounting area in a third of the first recesses;
    wherein the first, second, and third light-emitting elements are configured to be turned on and off discretely with respect one another,
    wherein the second recess comprises annular portions each surrounding a corresponding one of the first recesses in a top view, and
    wherein, in a cross-sectional view:
    the second recess includes a first unit second recess located between the first light-emitting element and the second light-emitting element, and a second unit second recess located between the first light-emitting element and the third light-emitting element,
    the first unit second recess is defined by a first surface facing the first light-emitting element and a second surface facing the second light-emitting element,
    the second unit second recess is defined by a third surface facing the first light-emitting element and a fourth surface facing the third light-emitting element,
    an inclination angle of the first surface relative to the upper surface of the substrate is greater than an inclination angle of the second surface relative to the upper surface of the substrate, and
    an inclination angle of the third surface relative to the upper surface of the substrate is greater than an inclination angle of the fourth surface relative to the upper surface of the substrate.

2. The light source device according to claim 1, wherein, in the cross-sectional view, an inclination angle of each of the first, second, third, and fourth surfaces relative to the upper surface of the substrate is 40° or more and 70° or less in a cross-sectional view.

3. The light source device according to claim 1, wherein the upper surface of the light guide member is flat.

4. The light source device according to claim 1, wherein, in the cross-sectional view, an inclination angle of at least one of surfaces defining the first recesses relative to the upper surface of the substrate is 70° or more and 90° or less.

5. The light source device according to claim 1, further comprising a plurality of wavelength conversion members, each covering element-lateral-surfaces of a respective one of the light-emitting elements.

6. The light source device according to claim 1, wherein the illumination areas and the mounting areas are arranged in n rows and m columns, where n≥2 and m≥2.

7. The light source device according to claim 1, further comprising a plurality of covering members, each covering member covering an upper surface of a respective one of the light-shielding members.

8. The light source device according to claim 1 further comprising electronic components disposed in a space between the frame member and lateral surfaces of the light guide member.

9. The light source device according to claim 1,
    wherein, in the cross-sectional view, an inclination angle of each of the first, second, third, and fourth surfaces relative to the upper surface of the substrate is 40° or more and 70° or less in a cross-sectional view; and
    wherein, in the cross-sectional view, an inclination angle of at least one of the surfaces defining the first recesses relative to the upper surface of the substrate is 70° or more and 90° or less.

10. The light source device according to claim 1,
    wherein, in the cross-sectional view, an inclination angle of each of the first, second, third, and fourth surfaces relative to the upper surface of the substrate is 40° or more and 70° or less in a cross-sectional view;
    wherein the illumination areas and the mounting areas are arranged in n rows and m columns, where n≥2 and m≥2; and
    wherein the plurality of light-shielding members include a light-shielding member disposed on or above the upper surface of each respective light-emitting element mounted in the mounting areas in a first row, an n-th row, a first column, and an m-th column.

11. The light source device according to claim 1,
    wherein, in the cross-sectional view, an inclination angle of each of the first, second, third, and fourth surfaces relative to the upper surface of the substrate is 40° or more and 70° or less in a cross-sectional view;
    wherein, in the cross-sectional view, an inclination angle of at least one of the surfaces defining the first recesses relative to the upper surface of the substrate is 70° or more and 90° or less;
    wherein the illumination areas and the mounting areas are arranged in n rows and m columns, where n≥2 and m≥2; and
    wherein the plurality of light-shielding members include a light shielding member disposed on or above the upper surfaces of each respective light-emitting element mounted in the mounting areas in a first row, an n-th row, a first column, and an m-th column.

12. The light source device according to claim 1 further comprising:
   electronic components disposed in space between the frame member and lateral surfaces of the light guide member;
   wherein, in the cross-sectional view, an inclination angle of each of the first, second, third, and fourth surfaces relative to the upper surface of the substrate is 40° or more and 70° or less in a cross-sectional view.

13. The light source device according to claim 1 further comprising:
   electronic components disposed in space between the frame member and lateral surfaces of the light guide member;
   wherein, in the cross-sectional view, an inclination angle of each of the first, second, third, and fourth surfaces relative to the upper surface of the substrate is 40° or more and 70° or less in a cross-sectional view; and
   wherein, in the cross-sectional view, an inclination angle of at least one of the surfaces defining the first recesses relative to the upper surface of the substrate is 70° or more and 90° or less.

14. The light source device according to claim 5, wherein the plurality of wavelength conversion members include a first wavelength conversion member located between the upper surface of the second light-emitting element and the first light-shielding member and a second wavelength conversion member located between the upper surface of the third light-emitting and the second light-shielding member.

15. The light source device according to claim 6, wherein the plurality of light-shielding members include a light shielding member disposed on or above the upper surface of each respective light-emitting element mounted in the mounting areas in a first row, an n-th row, a first column, and an m-th column.

16. The light source device according to claim 7, wherein the upper surface of the substrate and an upper surface of the covering member have similar colors.

17. The light source device according to claim 7, wherein a value of the upper surface of the substrate and a value of an upper surface of the covering member in the Munsell color system are four or less.

* * * * *